United States Patent
Huang et al.

(10) Patent No.: US 10,386,440 B2
(45) Date of Patent: Aug. 20, 2019

(54) MULTI-SHOT MAGNETIC-RESONANCE (MR) IMAGING SYSTEM AND METHOD OF OPERATION THEREOF

(71) Applicant: KONINKLIJKE PHILIPS N.V., Eindhoven (NL)

(72) Inventors: Feng Huang, Eindhoven (NL); George Randall Duensing, Eindhoven (NL); Bida Zhang, Eindhoven (NL)

(73) Assignee: KONINKLIJKE PHILIPS N.V., Eindhoven (NL)

(*) Notice: Subject to any disclaimer, the term of this patent is extended or adjusted under 35 U.S.C. 154(b) by 197 days.

(21) Appl. No.: 15/322,760

(22) PCT Filed: Jun. 30, 2015

(86) PCT No.: PCT/IB2015/054905
§ 371 (c)(1),
(2) Date: Dec. 29, 2016

(87) PCT Pub. No.: WO2016/001836
PCT Pub. Date: Jan. 7, 2016

(65) Prior Publication Data
US 2017/0146630 A1 May 25, 2017

(30) Foreign Application Priority Data
Jul. 3, 2014 (WO) ................ PCT/CN2014/081589

(51) Int. Cl.
*G01V 3/00* (2006.01)
*G01R 33/565* (2006.01)
(Continued)

(52) U.S. Cl.
CPC ... *G01R 33/56509* (2013.01); *G01R 33/4818* (2013.01); *G01R 33/5608* (2013.01); *G01R 33/5616* (2013.01); *G01R 33/56341* (2013.01)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS 5,828,718 A * 10/1998 Ruth ................ A61B 6/032
378/19
6,853,191 B1 2/2005 Miller et al.
(Continued)

FOREIGN PATENT DOCUMENTS

WO 2010109348 A2 9/2010

OTHER PUBLICATIONS

Chen N-k, Guidon A, Chang H-C, Song AW. A robust multi-shot scan strategy for high-resolution diffusion weighted MRI enabled by multiplexed sensitivity-encoding (MUSE). NeuroImage 2013;72:41-47.
(Continued)

*Primary Examiner* — Walter L Lindsay, Jr.
*Assistant Examiner* — Frederick Wenderoth

(57) ABSTRACT

A magnetic resonance (MR) imaging (MRI) system (100, 1500), includes at least one controller (110, 1510) configured to: perform a multi-shot image acquisition process to acquire MR information for at least one multi-shot image set; train a convolution kernel including data on at least a portion of the MR information obtained without the use of the gradient or by using a self-training process. The convolution kernel includes convolution data. The MR information obtained with the use of a gradient for at least two of the image shots of the at least one multi-shot image set is iteratively convolved with the trained convolution kernel. The synthetic k-space data for the at least two image shots of the at least one multi-shot image set is projected into image space. The projected synthetic k-space data that are projected into the image space to form image information.

18 Claims, 13 Drawing Sheets

(51) Int. Cl.
  *G01R 33/48* (2006.01)
  *G01R 33/563* (2006.01)
  *G01R 33/56* (2006.01)
  *G01R 33/561* (2006.01)
(58) Field of Classification Search
  USPC ........................................................ 342/309
  See application file for complete search history.

(56) References Cited

U.S. PATENT DOCUMENTS

| | | | |
|---|---|---|---|
| 7,439,739 | B2 | 10/2008 | Beatty |
| 7,795,869 | B1 | 9/2010 | Bydder |
| 8,922,209 | B2 | 12/2014 | Alford et al. |
| 2006/0250131 | A1 | 11/2006 | Reeder et al. |
| 2008/0205730 | A1 | 8/2008 | Stehning et al. |
| 2008/0310696 | A1 | 12/2008 | Hwang |
| 2009/0284257 | A1* | 11/2009 | Bammer .......... G01R 33/56341 324/307 |
| 2010/0264925 | A1* | 10/2010 | Stemmer .......... G01R 33/56375 324/309 |
| 2011/0234222 | A1* | 9/2011 | Frahm ................ G01R 33/4824 324/309 |
| 2013/0028538 | A1* | 1/2013 | Simske ........................ 382/300 |

OTHER PUBLICATIONS

Pruessmann KP, Weiger M, Scheidegger MB, Boesiger P. Sense: Sensitivity encoding for fast MRI. MagnReson Med 1999;42:952-962.

Zhao B, Haldar JP, Brinegar C, Liang Z-P. Low rank matrix recovery for real-time cardiac MRI. IEEE ISBI; 2010. p. 996-999.

Jeong H-K, Gore JC, Anderson AW. High-Resolution Human Diffusion Tensor Imaging Using 2-D Navigated Multishot SENSE EPI at 7 T. MagnReson Med 2013;69:793-802.

Fautz HP, Honal M, Saueressig U, Schafer O, Kannengiesser SAR. Artifact Reduction in Moving-Table Acquisitions Using Parallel Imaging and Multiple Averages. Magn Reson Med 2007;57:226-232.

Walsh DO, Gmitro AF, Marcellin MW. Adaptive Reconstruction of Phased Array MR Imagery. Magn Reson Med 2000;43:682-690.

Huang F, Lin W, Börnert P, Li Y, Reykowski A. Data Convolution and Combination Operation (COCOA) for Motion Ghost Artifacts Reduction. MagnReson Med 2010;64(1):157-166.

Truong TK, Chen NK, Song AW. Inherent correction of motion-induced phase errors in multishot spiral diffusion-weighted imaging. Magn Reson Med 2012;68(4):1255-1261.

Griswold MA, Jakob PM, Heidemann RM, Mathias Nittka, Jellus V, Wang J, Kiefer B, Haase A. Generalized Autocalibrating Partially Parallel Acquisitions (GRAPPA). Magn Reson Med 2002;47:1202-1210.

Bihan et al "Artifacts and Pitfalls in Duffision MRI" Journal of Magnetic Resonance Imaging, vol. 24, No. 3, Sep. 1, 2006, p. 478-488.

Uecker et al "Inverse Reconstruction Method for Segmented Multishot Diffusion Weighted MRI with . . . " Magnetic Resonance im Med. vol. 62, No. 5, Nov. 1, 2009.

Chen et al "High Resolution Diffusion Weighted MRI Enabled by Mutli-Shot EPI with Multiplexed Sensitivity Encoding" Proc. Intl. Soc. Mag. Reson. Med. 21 (2013). p. 56.

Bi et al "Robust Low-Rank Matrix Completion for Sparse Motion Correction in Auto Calibration Pi" Proc. Intl. Soc. Mag. Reson. Med. 21 (2013) p. 2584.

* cited by examiner

MULTI-SHOT MAGNETIC-RESONANCE (MR) IMAGING SYSTEM AND METHOD OF OPERATION THEREOF

CROSS REFERENCE TO RELATED APPLICATIONS

This application is a U.S. national phase application of International Application No. PCT/IB2015/054905, filed on Jun. 30, 2015, which claims the benefit of PCT/CN2014/081589 filed on Jul. 3, 2014 and is incorporated herein by reference.

The present system relates to a magnetic resonance imaging (MRI) system for reducing motion artifacts in reconstructed magnetic resonance (MR) images which are acquired using multi-shot (ms) image acquisition methods and, more particularly, to an MRI system which may include a reduction in artifacts due to inter-shot motion in multi-shot MR acquisitions and a method of operation thereof.

Multi-shot (ms) acquisitions are widely adopted in clinical magnetic resonance imaging (MRI) applications to obtain high spatial resolution diagnostic information. Two common multi-shot MR imaging methods are known as: Turbo-spin echo (TSE) and ms echo-planar imaging (ms-EPI). These imaging methods can be used to obtain high-spatial-resolution diffusion-weighted imaging (DWI). However, inter-shot motion is almost inevitable and can lead to diminished image clarity in multi-shot MR images. Further, as multi-shot methods require multiple acquisitions, they may require longer acquisition times than are required for single-shot acquisitions. These longer acquisition times may exacerbate inter-shot motion.

For example, in ms-EPI based diffusion weighted imaging (DWI), slight amounts of inter-shot motion can introduce significant phase difference between inter-shot images. Although navigator-based correction methods may be used in an attempt to remove this introduced phase difference, navigator-based correction methods typically fail if the inter-shot motion differs between the navigation and the actual DWI data. The assumption of the navigator-based correction methods is that the navigator and the corresponding imaging data have the same phase. If there is motion between the navigator and a corresponding imaging data acquisition to acquire imaging shots, the phase from navigator cannot accurately correct the phase difference in the imaging shots. To avoid this problem, a phase correction method which does not employ a navigator-based correction method may be used. One such phase correction method relies upon an average reconstruction method (hereinafter an averaging method) which performs an average reconstruction (R5) of each shot of a multi-shot set. The reconstruction of each shot is generated using a partially parallel imaging (PPI) method such as a sensitivity encoding (SENSE) method. Unfortunately, the SENSE method may dramatically reduce the signal-to-noise ratio (SNR) and may introduce image artifacts, especially when the number of shots in a multi-shot acquisition is greater than a threshold value such as 4. Thus, when using a conventional PPI averaging method, the SNR can be dramatically reduced, and when using a conventional navigator-based method, a phase difference cannot be efficiently removed.

Although TSE imaging methods are the workhorse of many MR imaging applications, TSE imaging methods are sensitive to motion. While many motion suppression methods suppress rigid motion artifacts, they cannot generally efficiently suppress non-rigid motion artifacts. However, in an attempt to suppress non-rigid motion artifacts, a data convolution and combination operation (COCOA) method (R7) has been developed. Unfortunately, even when using the COCOA method, some residual motion artifacts may still be observed. More particularly, the COCOA method may be used to reduce motion artifacts in TSE imaging methods due to continuous non-rigid motion. However, if the motion is substantial the COCOA method may be inadequate as some residual artifacts may be observed.

Further, a recently introduced MUSE method (R1) may cleverly use the phase information from an initial SENSE (R2) reconstruction in a multiplexed SENSE equation system. In this method, a SENSE factor in an initial SENSE operation may equal the number of shots. Unfortunately, high-quality ms-EPI images can only be robustly produced by MUSE method when number of shots is four or fewer with a typical 8-channel head coil, and as a self-navigation algorithm, the MUSE method has few advantages over navigator-based methods (R1). For example, when more than four shots are necessary for higher spatial resolution or lower geometry distortion level in 3T or 7T (R4), the initial SENSE reconstruction in MUSE may fail and not provide accurate phase information. Further, a typical SENSE reconstruction with an acceleration factor 8 will typically not result in meaningful phase information for MUSE, and may lead to a failed MUSE reconstruction. This is illustrated with reference to FIGS. 9A and 9B, wherein FIG. 9A shows an image 900A which illustrates magnitude of one shot of an 8-shot SENSE-based reconstruction and FIG. 9B shows an image 900B which illustrates phase of one shot of an 8-shot SENSE reconstruction. The image quality of both of the magnitude and the phase of the 8-shot sense reconstruction is poor. Therefore, the SENSE reconstruction may be considered to be a failed reconstruction.

Accordingly, the embodiments of the present system may provide systems and methods which among other things may overcome the disadvantages of typical systems.

The system(s), device(s), method(s), user interface(s), computer program(s), processes, etc. (hereinafter each of which will be referred to as system, unless the context indicates otherwise) described herein address problems, such as image artefacts, and/or provide one or more alternatives to prior art systems.

In accordance with embodiments of the present system, there is provided a magnetic resonance (MR) imaging (MRI) system which may include at least one controller. The at least one controller may be configured to: perform a multi-shot image acquisition process to acquire MR information for at least one multi-shot image set including a plurality of image shots each including corresponding data, at least a portion of the MR information being obtained with the use of a gradient and at least another portion of the MR information being obtained without the use of the gradient; train a convolution kernel including data on at least a portion of the MR information obtained without the use of the gradient or by using a self-training process, the convolution kernel including convolution data; iteratively convolve the MR information obtained with the use of a gradient for at least two of the plurality of image shots of the at least one multi-shot image set with the trained convolution kernel to form synthetic k-space data for each corresponding shot of the at least two image shots of the plurality of image shots; project the synthetic k-space data for the at least two image shots of the plurality of image shots of the at least one multi-shot image set into image space; and/or average the projected synthetic k-space data that are projected into the image space to form image information.

It is further envisioned that the at least one controller may holds the data of the convolution kernel constant when performing the iterative convolution for the corresponding multi-shot set. It is further envisioned that the at least one controller may be further configured to fix the data of the convolution kernel so as to form a consistent correlation during the iterative convolution for the at least one multi-shot image set. Moreover, in accordance with embodiments of the present system, the synthetic k-space data may forms a number of shot (Ns) sets of synthetic k-space data. It is also envisioned that during the averaging the at least one controller may be configured to average magnitudes of the synthetic k-space data for the at least two shots of the plurality of image shots.

In accordance with embodiments of the present system, the MRI system may include a display and that the at least one controller may be configured to render the formed image information on the display.

In accordance with yet further embodiments of the present system, there is provided a method of reconstructing images obtained by a magnetic resonance (MR) imaging (MRI) system having at least one controller. The method may be performed by the least one controller of the MR imaging system and may include one or more acts of: performing a multi-shot image acquisition process to acquire MR information for at least one multi-shot image set including a plurality of image shots each including corresponding data, at least a portion of the MR information being obtained with the use of a gradient and at least another portion of the MR information being obtained without the use of the gradient; training a convolution kernel comprising data on at least a portion of the MR information obtained without the use of the gradient, the convolution kernel including convolution data; iteratively convolving the MR information obtained with the use of a gradient for at least two of the plurality of image shots of the at least one multi-shot image set with the trained convolution kernel to form synthetic k-space data for each corresponding shot of the at least two image shots of the; projecting the synthetic k-space data for the at least two of the plurality of image shots into image space; and averaging the projected synthetic k-space data that are projected into image space to form image information.

It is envisioned that the method may further include an act of holding the data of the convolution kernel constant when performing the iterative convolution for the corresponding multi-shot set. It is further envisioned that the method may include an act of fixing the data of the convolution kernel so as to form a consistent correlation during the iterative convolution for the at least one multi-shot image set. In accordance with embodiments of the present system, the synthetic k-space data may form a number of shot (Ns) sets of synthetic k-space data. It is further envisioned that the act of averaging may further include an act of magnitudes of the synthetic k-space data for the at least two shots of the at least one multi-shot image set. It is also envisioned that the method may include an act of rendering the formed image information on a display.

In accordance with yet further embodiments of the present system, there is provided a computer program stored on a computer readable non-transitory memory medium. The computer program may be configured to reconstruct images obtained from a magnetic resonance (MR) image system and may include a program portion which may be configured to: perform a multi-shot image acquisition process to acquire MR information for at least one multi-shot image set including a plurality of image shots each including corresponding data, at least a portion of the MR information being obtained with the use of a gradient and at least another portion of the MR information being obtained without the use of the gradient; train a convolution kernel including data on at least a portion of the MR information obtained without the use of the gradient, the convolution kernel comprising convolution data; iteratively convolve the MR information obtained with the use of a gradient for at least two of the plurality of image shots of the at least one multi-shot image set with the trained convolution kernel to form synthetic k-space data for each corresponding shot of the at least two image shots; project the synthetic k-space data for the at least two image shots of the plurality of image shots of the at least one multi-shot image set into image space; and average the projected synthetic k-space data that are projected into the image space to form image information.

It is envisioned that the computer program may be further configured to hold the data of the convolution kernel constant when performing the iterative convolution for the corresponding multi-shot set. It is also envisioned that the program portion may be further configured to fix the data of the convolution kernel so as to form a consistent correlation during the iterative convolution for the at least one multi-shot image set. It is also envisioned that during the averaging the program portion may be further configured to average magnitudes of the synthetic k-space data for the at least two shots of the at least one multi-shot image set. In accordance with some embodiments, it is envisioned that the program portion may be further configured to render the formed image information on a display.

In accordance with yet other embodiments of the present system, there is provided a magnetic resonance (MR) imaging (MRI) system which may include at least one controller configured to: perform a multi-shot image acquisition process to acquire MR information for a plurality of image shots of a multi-shot image set, each of the image shots including corresponding image data; compose a matrix based upon the image data for each image shot of the multi-shot image set; determine Eigen values and vectors for matrix; determine a largest Eigen value from among the Eigen values; and form a composite image based upon a combined image corresponding to the largest Eigen value.

It is further envisioned that the at least one controller may be further configured to normalize the energy of the composite image. It is also envisioned that the at least one controller may be configured to reconstruct the MR information to form the image data for each corresponding image shot of the plurality of image shots of the at least one multi-shot image set. In accordance with yet further embodiments of the present system, there is provided a magnetic resonance (MR) imaging (MRI) system which may include at least one controller that may be configured to: perform a multi shot image acquisition to acquire MR information for a number of scans (NEX) of a multi shot image set having a number of shots (NS), each of the image shots including corresponding image data so that the acquired MR information comprises image information for NS*NEX images; reconstruct the image information for the NS*NEX images and a target image by treating the image information for the NS*NEX images and the target image as unknown sets and numerically solving the unknown sets jointly; and/or render the reconstructed image.

It is further envisioned that when performing the reconstruction, the at least one controller may be further configured to employ at least one of a convolution method and a low-rank method to solve the unknown sets.

The invention is explained in further detail, and by way of example, with reference to the accompanying drawings wherein.

Figure 8A:
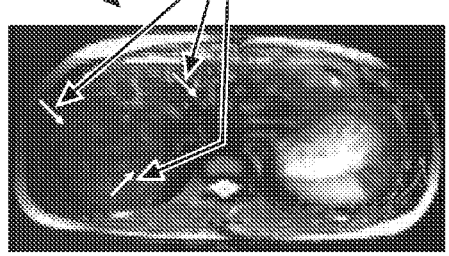
Figure 8B:
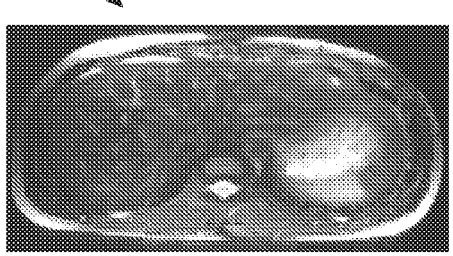
Figure 9A:
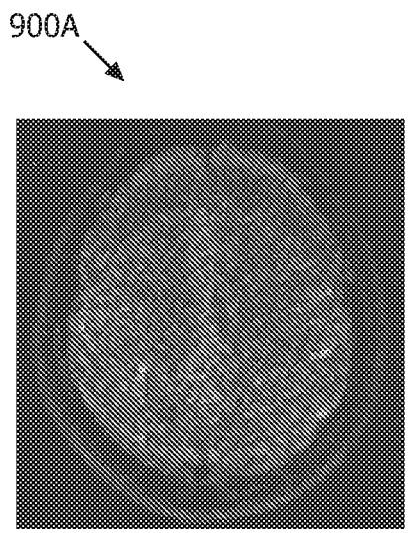
Figure 9B:
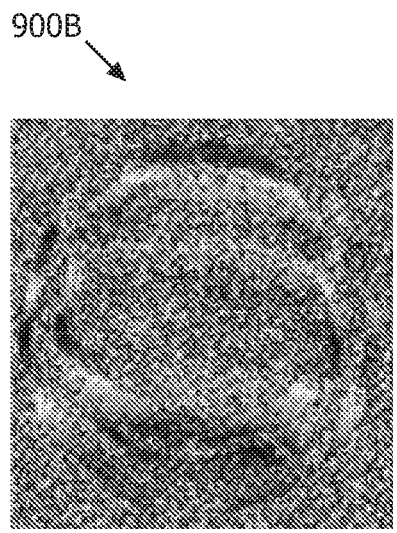
Figure 10:
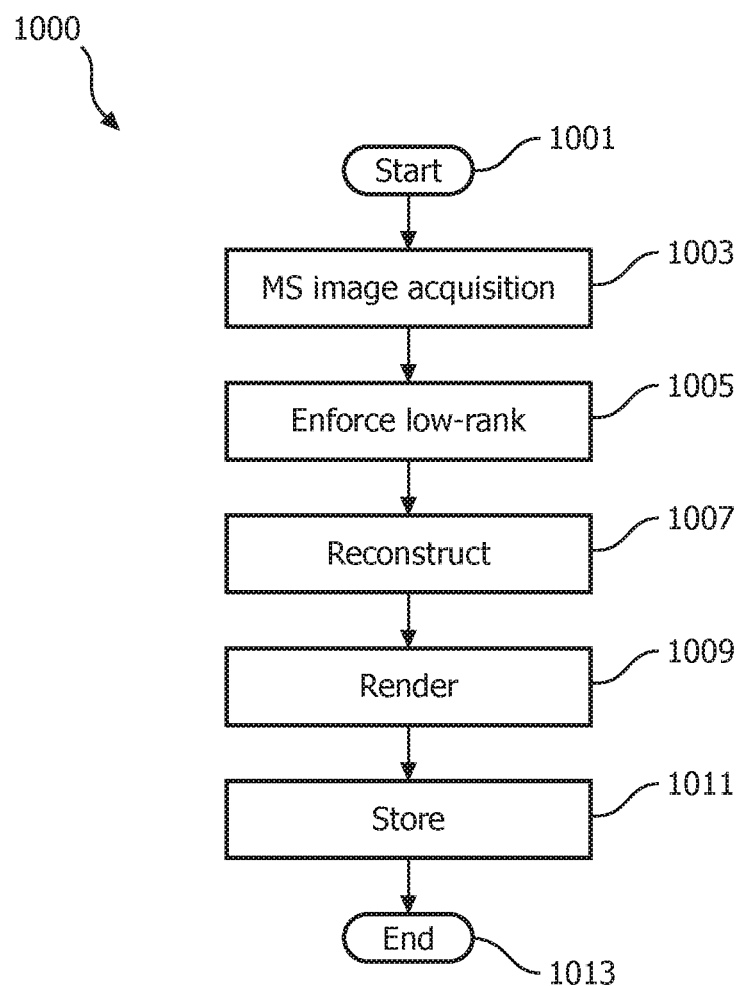
Figure 11:
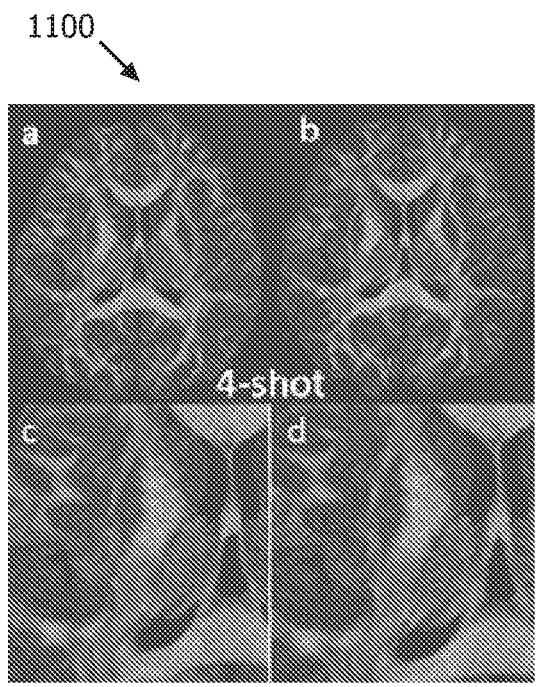
Figure 12:
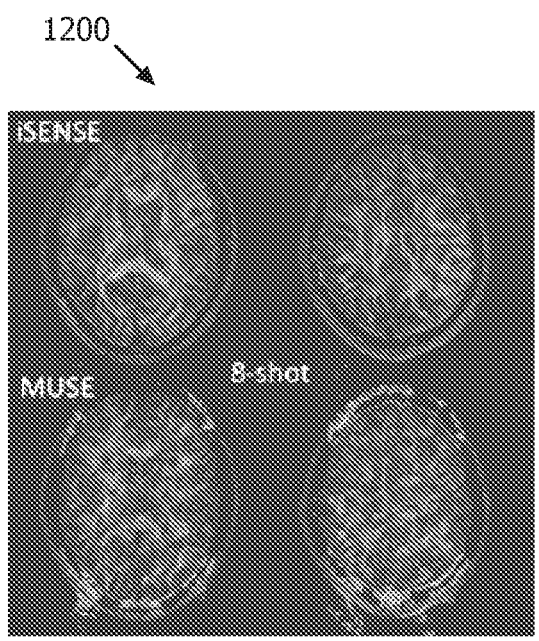
Figure 13:
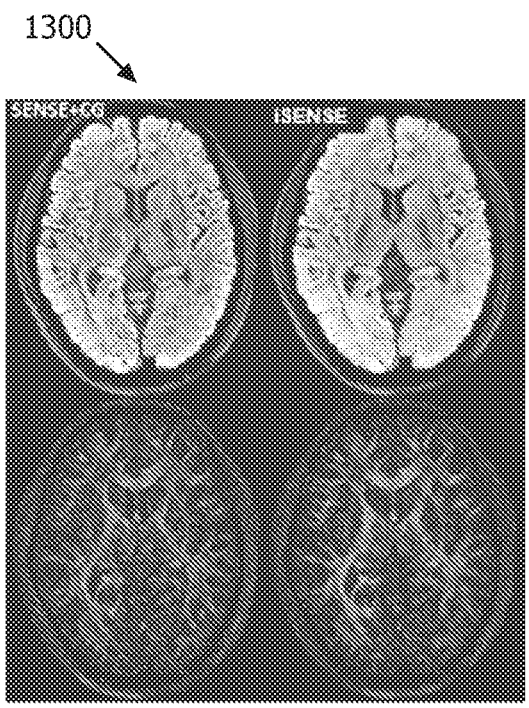
Figure 14:
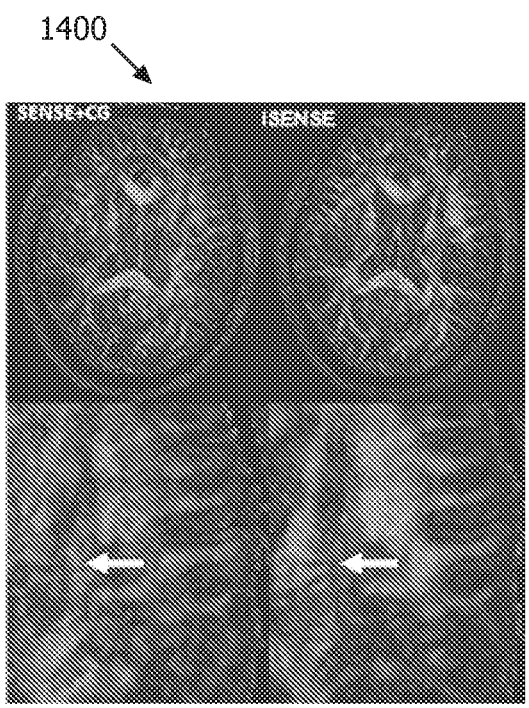
Figure 15:
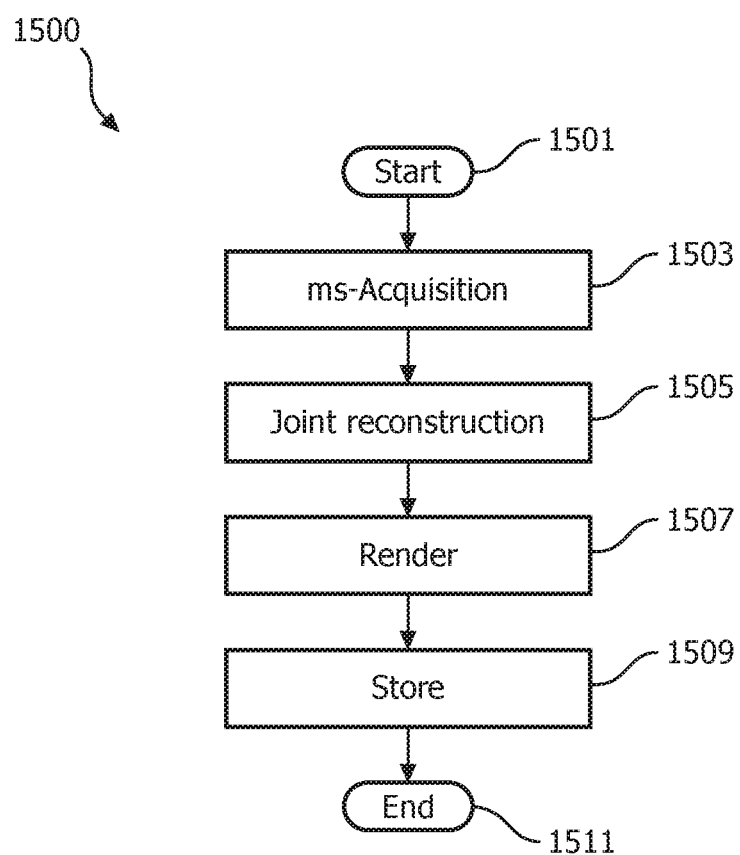
Figure 16:
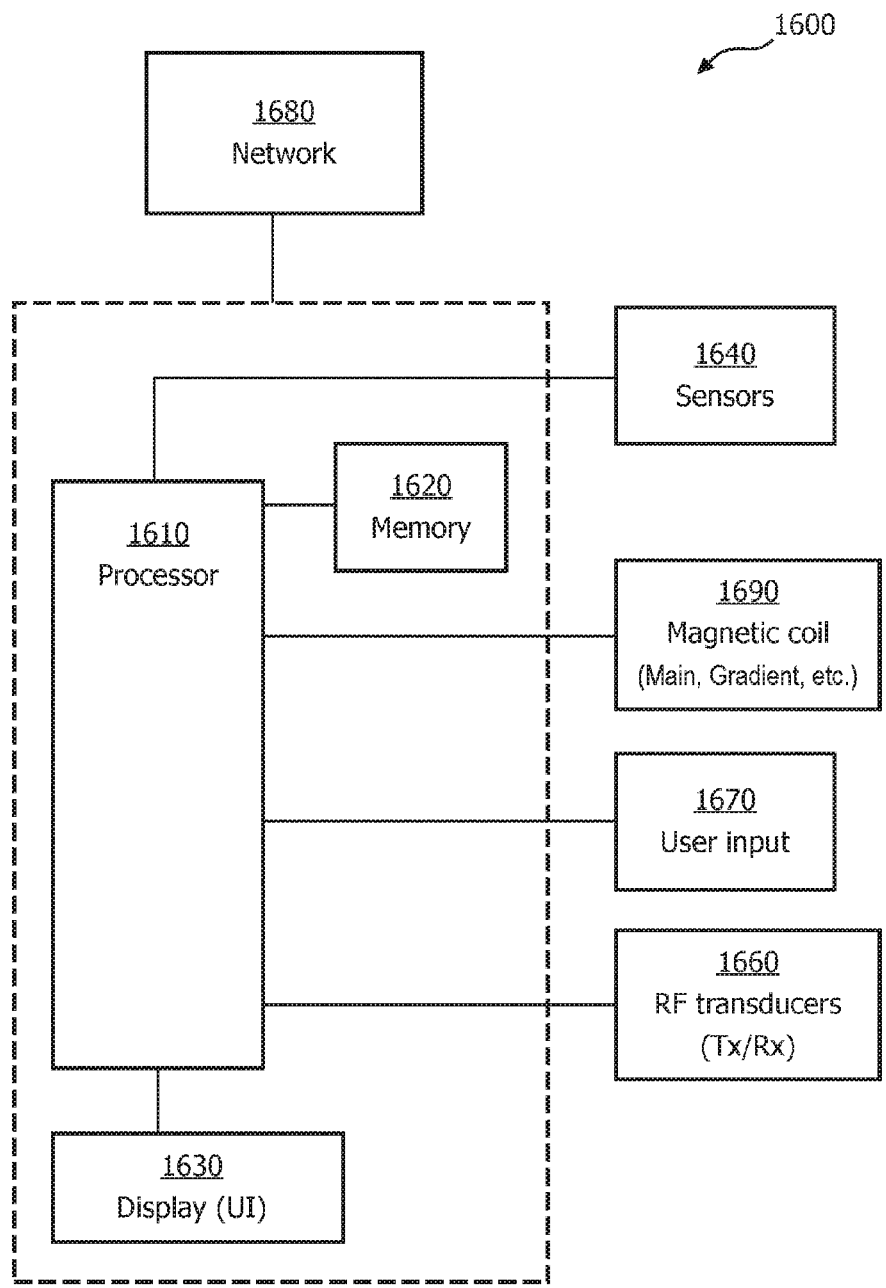

7B shows an 8-shot EPI DWI image reconstructed in accordance with embodiments of the present system;

FIG. 8A shows a 4-shot TSE liver image reconstructed in accordance with a conventional averaging method;

FIG. 8B shows a 4-shot TSE liver image reconstructed in accordance embodiments of the present system;

FIG. 9A shows an image which illustrates magnitude of one shot of an 8-shot SENSE-based reconstruction;

FIG. 9B shows an image which illustrates phase of one shot of an 8-shot SENSE reconstruction;

FIG. 10 is a flow diagram that illustrates a process performed by a magnetic resonance system in accordance with embodiments of the present system FIG. 11 shows an FA map generated using a 4-shot shot data set operating in accordance with embodiments of the present system;

FIG. 12 shows an FA map generated using an 8-shot data set operating in accordance with embodiments of the present system;

FIG. 13 shows a map generated using an 8-shot data set operating in accordance with embodiments of the present system;

FIG. 14 shows a map generated using a 12-shot data set operating in accordance with embodiments of the present system;

FIG. 15 shows a flow diagram that illustrates a process performed by a magnetic resonance system in accordance with embodiments of the present system; and FIG. 16 shows a portion of a system in accordance with embodiments of the present system.

The following are descriptions of illustrative embodiments that when taken in conjunction with the following drawings will demonstrate the above noted features and advantages, as well as further ones. In the following description, for purposes of explanation rather than limitation, illustrative details are set forth such as architecture, interfaces, techniques, element attributes, etc. However, it will be apparent to those of ordinary skill in the art that other embodiments that depart from these details would still be understood to be within the scope of the appended claims. Moreover, for the purpose of clarity, detailed descriptions of well-known devices, circuits, tools, techniques and methods are omitted so as not to obscure the description of the present system. It should be expressly understood that the drawings are included for illustrative purposes and do not represent the entire scope of the present system. In the accompanying drawings, like reference numbers in different drawings may designate similar elements. The term and/or and formatives thereof should be understood to mean that only one or more of the recited elements may need to be suitably present (e.g., only one recited element is present, two of the recited elements may be present, etc., up to all of the recited elements may be present) in a system in accordance with the claims recitation and in accordance with one or more embodiments of the present system.

Figure 1:
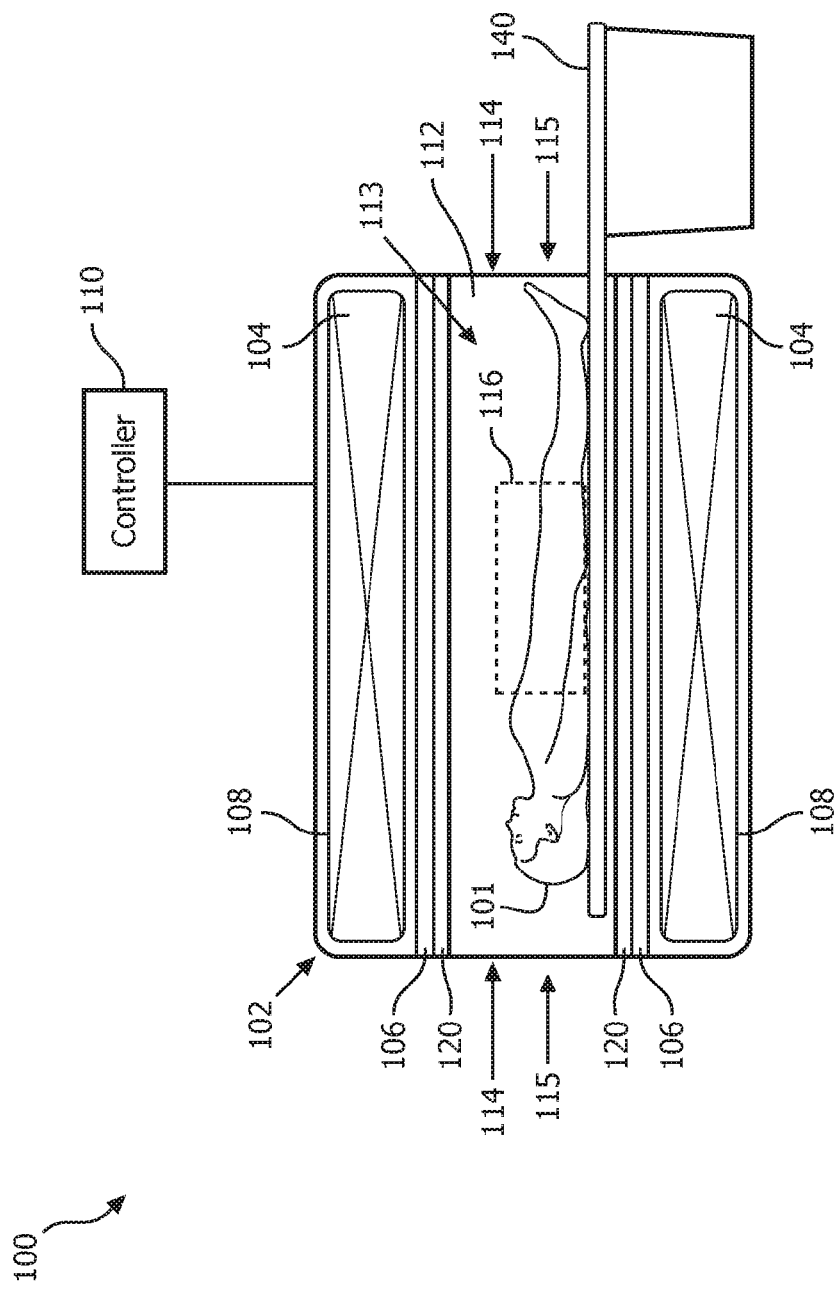
FIG. 1 shows a cutaway side view of a portion of a magnetic resonance (MR) system operating in accordance with embodiments of the present system.

FIG. 1 shows a cutaway side view of a portion of a magnetic resonance (MR) system 100 (hereinafter system 100 for the sake of clarity) operating in accordance with embodiments of the present system. The system 100 may include one or more of a controller 110, a memory, a display, a body 102, a main magnet 104, gradient coils 106, and a radio frequency (RF) portion 120. A patient support 140 may be provided to support an object-of-interest (001) such as a patient 101 (hereinafter patient for the sake of clarity) and/or to position the patient 101 in a desired position and/or orientation in relation to the body 102 for example under the control of the controller 110.

The body 102 may include at least one cavity 108 and a main bore 112 situated between opposed ends 114. The main bore 112 may be situated between opposed openings 115 of the body 102 and may be configured to receive the patient 101 through one of the opposed openings 115. The at least one cavity 108 may be configured to receive one or more of the main magnet 104, the gradient coils 106, and at least a portion of the RF portion 120. The body 102 may further include a cooling mechanism (e.g., a cryogenic cooling system, etc.) configured to cool portions of the system 100 such as the main magnet 104, if desired.

The controller 110 may control the overall operation of the system 100 and may include one or more logic devices such as processors (e.g., micro-processors, etc.) etc. The controller 110 may include one or more of a main magnet controller, a gradient controller, an RF controller, and a reconstructor. The main magnet controller may control the operation of the main magnet 104. The gradient controller may control the operation of the gradient coils 106. The RF controller may control the operation of the RF portion 120. The reconstructor may be operative to reconstruct image information based upon MR information obtained in accordance with embodiments of the present system. Accordingly, the reconstructor may reconstruct image information based upon multi-shot information. The reconstructed image information may, for example, be further processed, stored in a memory of the system for later use, and/or rendered on a display of the system for the convenience of a user.

The controller 110 may further determine or otherwise obtain scan sequences, scan parameters, etc. from a user and/or from the memory and apply them during a scanning procedure. For example, the controller 110 may obtain a scan sequence such as a multi-shot scan sequence from the memory and, for example, control one or more of the main magnet 104, the gradient coils 106 and/or RF portion 120 in accordance with the scanning sequence to obtain, for example, desired magnetic resonance information such as echo information. The controller 110 and/or portions thereof, may communicate with one or more of the memory, the display, the main magnet 104, the gradient coils 106, the RF portion 120, etc., via any suitable method such as via wired and/or wireless communication methods, via one or more networks (e.g., a wide area network (WAN), a local area network (LAN), the Internet, a proprietary communication bus, a controller area network (CAN), a telephony network, etc.).

The main magnet 104 may have a bore 113 and may be configured to generate a main magnetic field (e.g., a $B_0$ field) within the main bore 112. The main magnetic field may be substantially homogenous within a scanning volume of the main bore 112. The main magnet 104 may include one or more main magnets each configured to generate at least a portion of a main magnetic field. The main magnet 104 may be an annular (e.g., ring) magnet, a planar magnet, a split magnet, an open magnet, a semicircular (e.g., a C-shaped) magnet, etc. The main magnet 104 or portions thereof may be formed from any suitable material such as a superconducting material and/or may operate under the control of the controller 110.

The gradient coils 106 may include one or more gradient coils (e.g., x-, y-, and z-gradient coils) which may produce one or more gradient fields along one or more corresponding axes under the control of the controller 110. The RF portion 120 may include one or more RF transmission coils configured to transmit RF excitation pulses and/or receive (e.g., induced) MR signals (e.g., echo information) under the control of the controller 110. For example, in some embodiments, the RF portion 120 may include a transducer array of transmission and/or reception coils. The RF portion 120 may be situated within the main bore 112 of the body 102 and may be placed in a desired position and/or orientation such as under the patient support 140 to obtain images of a desired scanning volume within the main bore 112. The RF portion 120 may include wired- and/or wireless-type RF coils.

Illustratively, several methods to perform multi-shot acquisitions and image reconstruction in accordance with embodiments of the present system are discussed below. These methods may be known as: an enforcement of correlation method; an Eigen analysis image composition method, and a low-rank method. One or more of these methods or portions thereof may be utilized by themselves in accordance with embodiments of the present system or two or more may be utilized in combination with each other. Each of these methods may enforce data correlation among image shots of a multi-shot image set and may generate a final reconstruction from sets of synthetic k-space data sets. In accordance with embodiments of the present system, image reconstruction may be performed using a k-space data set which may be formed by a multiple-shot image set. Accordingly, each shot of the multiple-shot image set may include a subset of k-space.

Enforcement of Correlation Method

Figure 2:
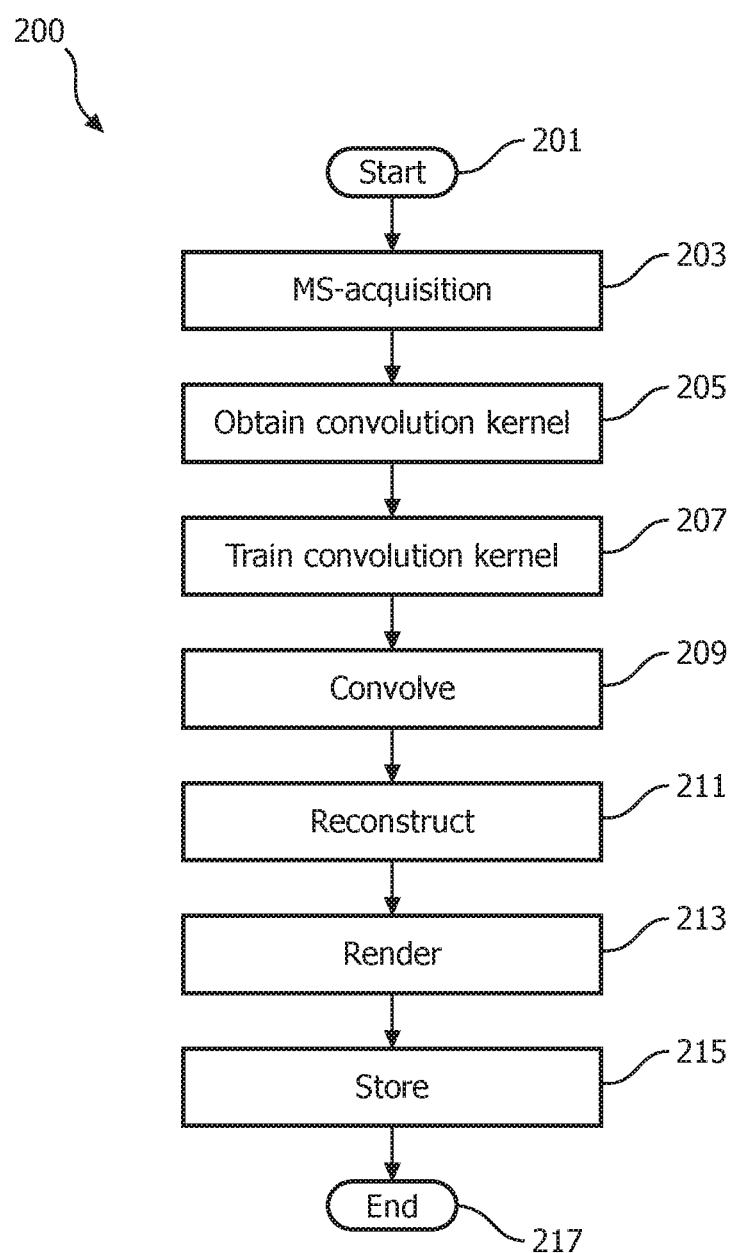
FIG. 2 is a flow diagram that illustrates a process performed by a magnetic resonance system in accordance with embodiments of the present system.

An enforcement of correlation method operating in accordance with embodiments of the present system is discussed with reference to FIG. 2 which shows a flow diagram that illustrates a process 200 performed by a magnetic resonance system in accordance with embodiments of the present system. The process 200 may be performed using one or more computers communicating over a network and may obtain information from, and/or store information to one or more memories which may be local and/or remote from each other. The process 200 and other processes herein in accordance with embodiments of the present system may include one of more of the following acts. Further, one or more of these acts may be combined and/or separated into sub-acts, if desired. Further, one or more of these acts may be skipped depending upon settings. The image information may include, for example, image information acquired from a multi-shot image sequence. In operation, the process 200 may start during act 201 and then proceed to act 203.

During act 203, the process may perform a multi-shot acquisition process to acquire MR information (e.g., echo information, analog MR information, etc.) for at least one multi-shot set comprising a plurality of shots. The multi-shot acquisition process may be performed in accordance with a multi-shot sequence such as an ms-EPI diffusion-weighed image (DWI) scan sequence. In accordance with some embodiments, the ms-EPI scan may be of interleaved-and/or read-out direction-types. The multi-shot acquisition process may further be performed using any suitable multi-shot acquisition method such as turbo-spin echo (TSE), multi-shot spiral, PROPELLOR, and/or ms-echo-planar imaging (ms-EPI) methods.

With regard to the at least one multi-shot set, this set may include a plurality of shots each of which may include corresponding MR information which may form at least a portion of k-space data for the corresponding shot. For example, assuming a full k-space has 256 k-space lines and that each shot may include 64 lines then, the process may require (256 lines)/(64 lines/shot)=4 shots during a given acquisition to form a complete k-space multiple-shot image set. Accordingly, 4 shots may be utilized to fill the k-space lines, though different numbers of shots may also be envisioned such as a multiple of 4 shots such as 8 shots.

Further, the number of shots (NS) may be set equal to a number of scans (NEX) which may be an integer greater than one and may be set by the system and/or the user. However, in yet other embodiments, NEX may be an integer which may be different from NS. Each of the number of scans (NEX) may corresponding to a complete k-space multiple-shot image set with a number of shots equal to NS (e.g., 4 shots such as illustratively discussed herein). Thus, assuming a multi-shot set includes k-space data of L k-space scan lines (e.g., see, FIG. 5), then each of these L lines will be scanned NEX times and corresponding MR information is acquired and assigned to a corresponding shot of the corresponding multi-shot set. NEX multiple shot sets may be acquired. Accordingly, each k-space image set may be scanned NEX times. Thus, each of the L k-space lines may be considered to be scanned NEX times. For example, assuming NS is equal to three, then there may be first through third shots for a given acquisition. The first shot may include MR information for the first of the NS acquisitions of each of the L k-space lines; the second shot may include MR information for the second of the NS acquisitions of each of the L k-space lines, and the third shot may include MR information for the third of the NS acquisitions of each of the L k-space lines. This process may be further explained with reference to FIG. 5 and the corresponding text. In accordance with embodiments of the present system, the process may obtain a plurality (e.g., where the plurality may be equal to NEX) of multi-shot sets, if desired.

Further, the k-space data may include MR data such as b=0 MR data which may include MR information obtained without the use of a gradient (and which may be known as a b=0 (the k-space, including b=0 and b>0, may be composed by multi-shots)) and b>0 MR data which includes MR information obtained with the use of gradients. Thus, the b=0 data may correspond with a least one multi-shot set which was acquired without the use of a gradient (e.g., MR image information for an image without a gradient (e.g., b=0)) and the b>0 data may correspond with at least one multi-shot set that was obtained with the use of a gradient (e.g., MR image information for an image using a gradient (e.g., b>0)) in accordance with embodiments of the present system. In accordance with embodiments of the present system, values of b may range from 0 to b where, for example, b may be equal to 800. However, in accordance with yet other embodiments b may have other values. In accordance with embodiments, the k-space data may correspond with MR echo information. For example, in some embodiments, the process may distinguish between information corresponding with b=0 (e.g., b=0 information such as a b=0 shot(s)) and information corresponding with b>0 (e.g., b>0 information). The gradient may be used for diffusion weighted imaging (DWI). To detect diffusion, which may be related to direction, a magnet gradient may be applied along a certain direction in MR.

The process may further obtain initialization information from a user and/or from a memory of the system. The initialization information may include information such as a scan sequence, a number L of k-space lines to scan, a value of b, a value of NS and a value of NEX. For example, in accordance with some embodiments, NS may be set to 2, NEX may be set to an integer of 1 or higher, and B may be set to 800 as illustratively discussed below.

After completing act 203, the process may continue to act 205 where the process may obtain a convolution kernel for data correction. The convolution kernel may be acquired from a memory of the system and/or may be formed by the process, if desired. The convolution kernel may form a compact matrix and, in accordance with some embodiments, may not use the acquired signal from the same shot (e.g., the b=0 k-space in the present embodiment). For example, the convolution kernel may include an N×M matrix where N represents a number of rows and M represents a number of columns and may be pre-defined parameters, if desired. For example, in accordance with some embodiments, the convolution kernel may be a 5×5 matrix. However, other values are also envisioned. Further, either the k-space of the b=0 or a current to-be reconstructed image may be used by the processes for the calculation of the convolution kernel. In addition, any suitable data fitting scheme, such as that disclosed in R7, may be used by embodiments of the present system for kernel calculation. After completing act 205, the process may continue to act 207.

During act 207, the process may train the convolution kernel on training information such as b=0 information (e.g., the MR data acquired without the use of a gradient) or other extraneous data, as may be desired. However, in yet other embodiments, the convolution kernel may be self-trained. However, in accordance with some embodiments of the present system, and as discussed above, the convolution kernel should not include MR image information from the same shot (e.g., the shot which it is trained to). Thus, the convolution kernel may be trained in accordance with additional data such as b=0 data in DWI. This is illustrated with reference to Equation (1) below which demonstrates a convolution and kernel calculation scheme in accordance with embodiments of the present system.

$$\sum_{j=1}^{J}\sum_{l'=1}^{L} W_{\Delta k_j, l'} S_{l'}(k_r - \Delta k_j) = S_l(k_r) \quad \text{Eq. (1)}$$

Where J is a number of neighboring k-space signals used in the linear combination, L is a number of coil elements. $S_{l'}(k_r - \Delta k_j)$ denotes k-space signals from element l' with shift $\Delta k_j$ used to approximate signal $S_l(k_r)$ from the coil element l. $W_{\Delta k_j, l'}$ represents weights and may be dependent upon coil element sensitivities (R9) and the relative shift $\Delta k_j$. An operation defined by Equation 1 is a convolution in k-space with the convolution kernel defined by $W_{\Delta k_j, l'}$. For calculation of $W_{\Delta k_j, l'}$, the center k-space of b=0 may be used for $S_l(k_r)$ and $S_{l'}(k_r - \Delta k_j)$, the unknown $W_{\Delta k_j, l'}$ may then be calculated by the system. After completing act 207, the process may continue to act 209.

During act 209, the process may perform a mathematical convolution process to iteratively convolve the MR information obtained using the gradient (e.g., the b>0 MR image information) with the trained convolution kernel to form a number of shot (Ns, number of shots) sets of synthetic k-space data. Thus, the process may iteratively convolve the b>0 k-space data with the trained convolution kernel for each of the plurality (e.g., NS) of shots of the multi-shot set. More particularly, for each shot of the plurality of shots (e.g., NS) of the multi-shot set, a set of synthetic k-space data may be formed by enforcing data consistency of the corresponding shot during the iterative convolution which may assure shot-wise fidelity. During each iteration, the data of a corresponding shot is fixed to be constant. By keeping each shot of the multi-shot set constant (e.g., through the convolution with the trained correlation kernel), each shot will result in a set of synthetic k-space data. The process may be repeated for each of the NEX scans of each NS lines of synthetic k-space data. Hence, Ns x NEX sets of synthetic k-space data may be generated by the process. After completing act 209, the process may continue to act 211.

During act 211, the process may form reconstructed image information by projecting each of the Ns×NEX sets (or selected ones of the Ns×NEX sets) of the synthetic k-space data in image space to form the corresponding reconstructed image information. The process may then determine "averages" of the image information with or without spatially adaptive weights as may be set by the system and/or user. The process may determine "averages" during each iteration of the convolution of act 209 and may employ any suitable method such as an SVD analysis type method as discussed herein, or other averaging schemes that may be suitably applied. The above-referenced "average" calculation may employ other suitable averaging method or methods such as singular value decomposition (SVD) analysis or a low rank method. After completing act 211, the process may continue to act 213.

During act 213, the process may render the reconstructed image information on a display of the system so that a user may view images obtained by embodiments of the present system. Further, the process may further provide a user interface (UI) with which a user may interact to change viewing parameters, enter information (e.g., notes, commands, selections, etc.), etc. In accordance with embodiments of the present system, one or more of image acquisition, processing and rendering may occur in real time or may be delayed, if desired. After completing act 213, the process may continue to act 215.

During act 215, the process may store information generated by the process such as the MR image information, the synthetic k-space information, the reconstruction information, etc., (as may be desired) in memory of the system for later use. As may be readily appreciated, at any time during and/or after the process 200, information may be stored for subsequent rendering and/or processing. After completing act 215, the process may continue to act 217 where the process may end.

In accordance with embodiments of the present system, the above-described process enforces data correlation consistency and shot-wise data consistency in acquired multi-shot MR data.

Any suitable multi-shot MR data may be acquired such as ms-EPI DWI or the like. In accordance with embodiments of the present system, if there is no phase difference due to inter-shot motion, the data correlation of b>0 data should be the same as the b=0 data. By enforcing data correlation trained from b=0 data, the phase difference may be iteratively removed.

Thus, the process 200 may include acts:
(1) An iterative enforcement act which iteratively enforces data correlation among channels. Convolution in k-space can be used to enforce the correlation. After convolution, a synthetic k-space can be generated. The correlation may be trained using additional data (e.g., b=0 data in DWI) or may be self-trained, and
(2) A shot-wise data consistency enforcement act where for each shot, a synthetic k-space may be generated for each shot by enforcing data consistency of the corresponding shot during iteration for example resulting in a number of shot sets of synthetic k-space. In other words, embodiments of the present system may employ shot-wise data consistency.

When, compared to the previously-discussed COCOA method, it is seen that although COCOA also uses data correlation methods, it does not perform nor depend upon iterative enforcement as performed by embodiments of the present system. Further, the COCOA method does not employ shot-wise data consistency enforcement.

Test Results

Figure 3A:
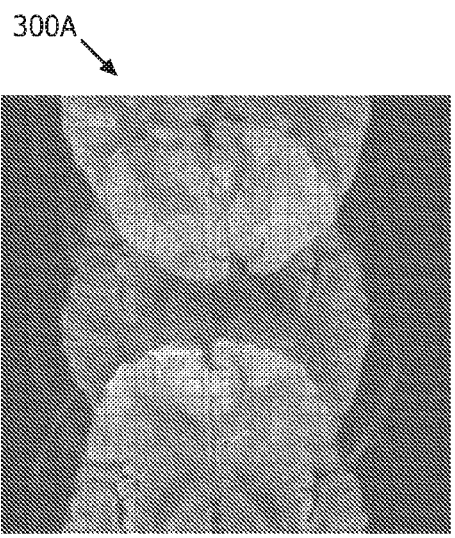
FIG. 3A shows an MR image reconstructed without phase correction.
Figure 3B:
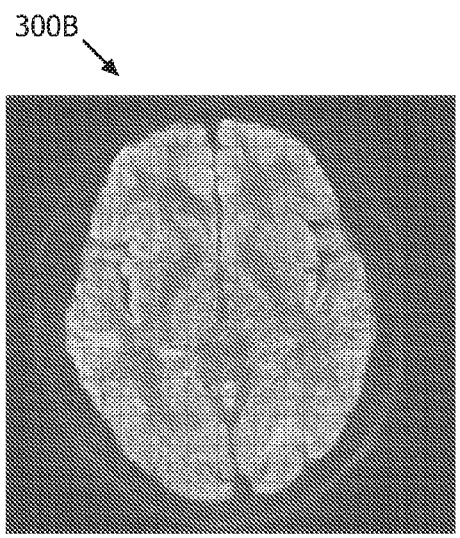
FIG. 3B shows an MR image reconstructed using an average of PPI.
Figure 3C:
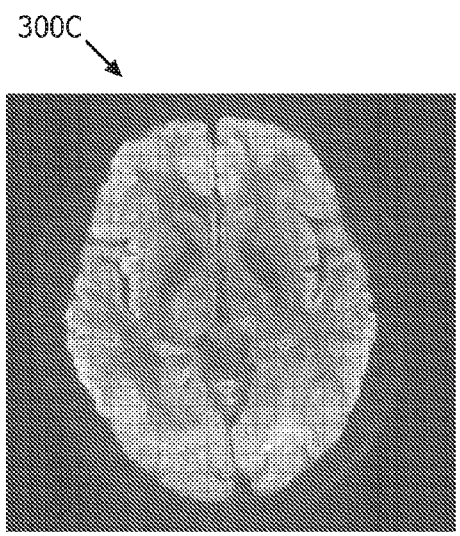
FIG. 3C shows an MR image reconstructed in accordance with embodiments of the present system.

Sample MR image information was obtained using an ms-EPI DWI methods operating on a Philips™ 3T coil in accordance with embodiments of the present system. The MR image information has 1 mm×1 mm×4 mm resolution by 4 interleaved EPI shots. b=800 and NS=2 is shown in FIGS. 3A through 3C. More particularly, FIG. 3A shows an MR image reconstructed without phase correction; FIG. 3B shows an MR image reconstructed using an average of PPI (e.g., an average of SENSE); and FIG. 3C shows an MR image reconstructed in accordance with embodiments of the present system. It can be seen that the image reconstruction performed in accordance with embodiments of the present system (e.g., image 3C) has clearly improved SNR than an image reconstructed using a conventional method which uses the average of SENSE of FIG. 3B.

Thus, embodiments of the present system may provide methods for the reduction of artifacts due to inter-shot motion in multi-shot acquisitions. It is further envisioned that embodiments of the present system may be used for spatial resolution in multi-shot EPI, DWI, and TSE imaging methods.

Eigen Analysis Image Composition Method

Figure 4:
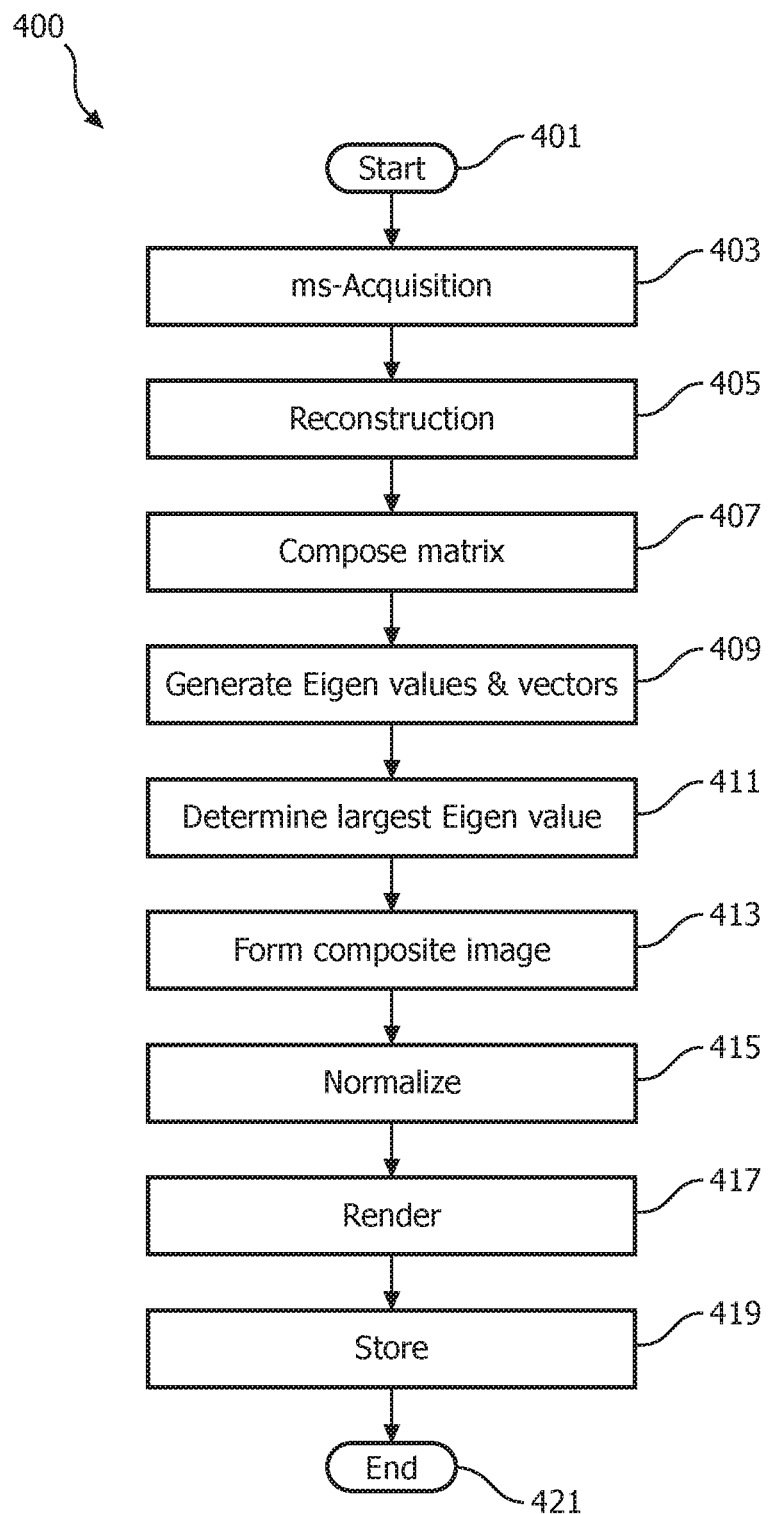
FIG. 4 is a flow diagram that illustrates a process performed by a magnetic resonance system in accordance with embodiments of the present system.

An Eigen analysis image composition method operating in accordance with embodiments of the present system is discussed herein below with reference to FIG. 4 which is a flow diagram that illustrates a process 400 performed by a magnetic resonance system in accordance with embodiments of the present system. The image information may include, for example, image information acquired from a multi-shot image sequence. In operation, the process may start during act 401 and then proceed to act 403.

During act 403, the process may perform a multi-shot image acquisition process to acquire MR image data (e.g., echo information, analog MR information, etc.) for a multi-shot image sequence (such as an ms-EPI diffusion-weighed image (DWI) scan sequence) having a plurality of shots. Thus, each multi-shot image sequence may form a shot set including a plurality of corresponding shots (e.g., NS shots, where NS is an integer >1). Further, one or more shot sets may be acquired. However, in the present embodiments only a single shot set is discussed for the sake of clarity.

During the image acquisition, each k-space may be filled by a set of shots which form a shot set. Thus, a full k-space may correspond to one MR image and may be composed of NS shots. Each shot set (e.g., an ms set) may include NS shots and may be scanned NEX times. Thus, it may be assumed that the process may acquire a number (e.g., NEX) of same images. In accordance with embodiments of the present system, this may provide a higher SNR and/or motion artifact level than conventional image reconstruction methods.

Further, the process may obtain initialization information from a user and/or from a memory of the system. The initialization information may include information such as a scan sequence, a number of k-space lines to scan, and values for NS and NEX. For example, in accordance with some embodiments, NS may be set to 3 and NEX may be set to 2. After completing act 403, the process may continue to act 405.

During act 405, the process may reconstruct a plurality of images based upon the acquired MR image data for a shot set. Thus, the process may reconstruct an image for each shot of the multi-shot set where the number of shots in a multi-shot set may be equal to NS. Assuming that each image shot set includes NS shots, then the process may reconstruct NS*NEX (where it will be assumed that NEX=1 for the sake of clarity so that NS*(1) image shots may be acquired) images each of which theoretically should be the same and thus, for the sake of this description, may be assumed to be the "same." However, due to motion and/or noise, one or more of the shots may be different from one or more of the other shots.

Figure 5:
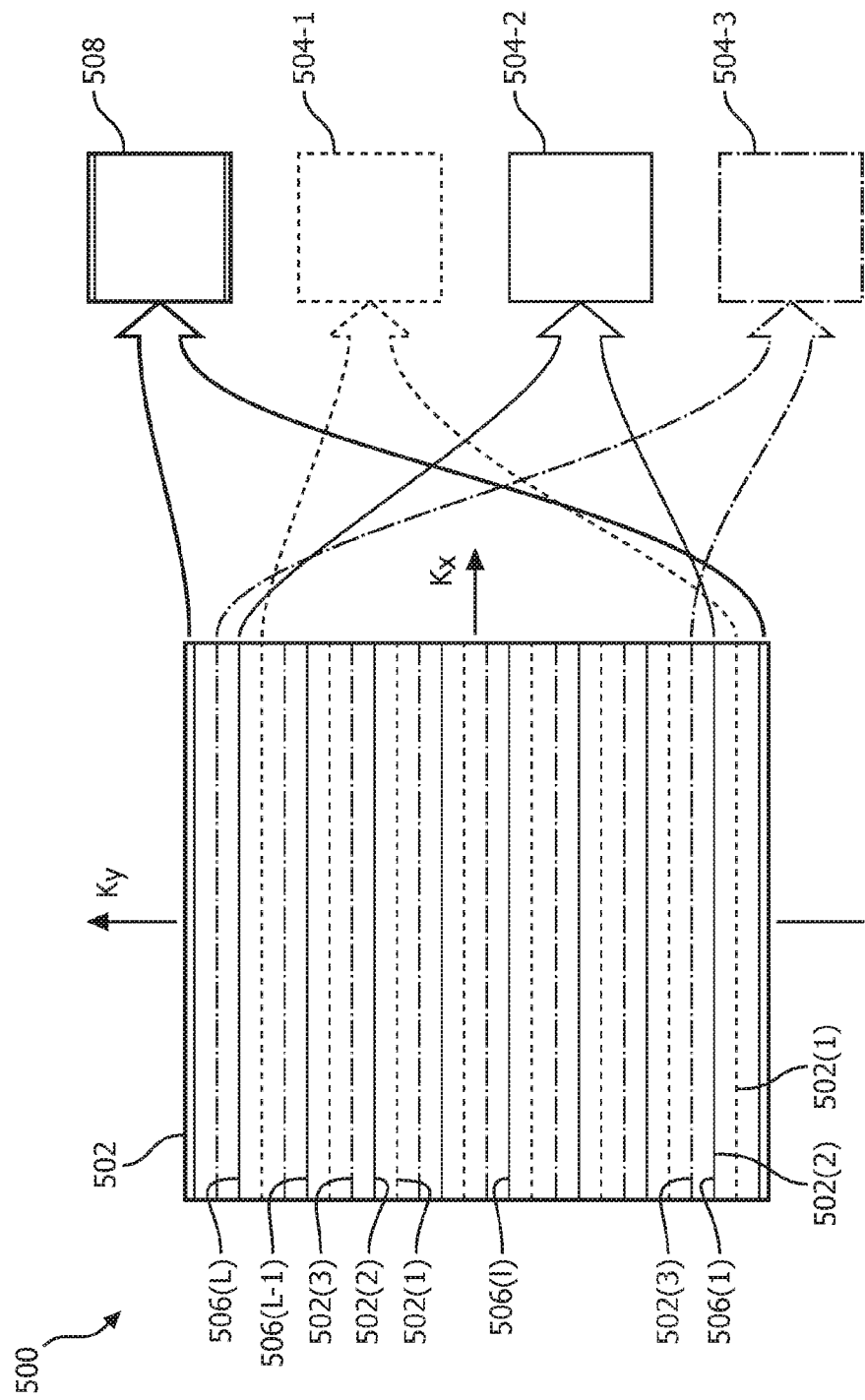
FIG. 5 is a graph illustrating k-space scan lines of a multi-shot set acquired in accordance with embodiments of the present system.

FIG. 5 is a graph 500 illustrating k-space scan lines of a multi-shot set acquired in accordance with embodiments of the present system. In graph 500, NS may be assumed to be equal to three and a number of scan lines equal to L. Thus, for each scan line 506(*l*) (where l ranges from 1 through L) there may be NS shot lines 502(1) through 502(3) each corresponding to a shot of the multi-shot set. Further, when data corresponding to each of these shots is reconstructed, a corresponding image may be formed such as shown by images 504-1 through 504-3 (generally 504-x). Thus, each of the images 504-x may be considered to be theoretically the same image. However, a reconstructed multi-shot image 508 may correspond with information from each of the shots of the multi-shot set (or selected shots or parts of the multi-shot set, if desired). Although a linear multi-shot set is shown in FIG. 5, embodiments of the present system may also be compatible with rotational scans (radial trajectory), etc. After completing act 405, the process may continue to act 407.

During act 407, the process may compose a matrix based upon the images of each of the shots of the multi-shot set. More particularly, the process may use each image (e.g., 504x) of the multi-shot set as a vector to compose the matrix which may represent a corresponding image. Accordingly, the process may form a plurality of matrixes each of which may represent a corresponding image. The process may store the matrix for each image in a memory of the system for later use. Further, the process may reshape one or more of these matrices to, for example, form a vector having a desired length. Thus, a corresponding vector may represent a column of a matrix of multiple images. After completing act 407, the process may continue to act 409.

During act 409, the process may generate Eigen values and corresponding Eigen vectors for the matrix. Accordingly, the process may for example apply a SVD analysis to the matrix to generate each of the Eigen values and Eigen vectors. Thus, the results of the SVD analysis, may provide the Eigen values and corresponding Eigen vectors. The process may determine the Eigen values using a suitable Eigen analysis method to extract common features among each image (shot) of the multi-shot image set. For example, an Eigen-analysis based method operating in accordance with embodiments of the present system may be utilized to adaptively (with local weights) combine phased array MR images for optimal SNR. This method, when operating in accordance with embodiments of the present system, may provide optimal SNR without knowledge of coil sensitivity information. This method may be referred to as a modified ACC method. Further, Eigen analysis is further discussed in R6 and may be suitably applied in accordance with embodiments of the present system. For each of the (original) images (e.g., of the original images formed during act 405), the elements of each Eigen vector (e.g., of the corresponding image) may be used as weights of each of these (original) images to generate a weighted summation of these images. This weighed summation may be called a composite image (e.g., see, act 413 below) which is a summed or combined image. Moreover, in accordance with embodiments of the present system, the SVD analysis performed may be considered a global analysis. After completing act 409, the process may continue to act 411.

During act 411, the process may determine a largest Eigen value from the Eigen values determined during act 409. The process may further determine the Eigen vector corresponding to the largest Eigen value. Thus, for the determined largest Eigen value, the process may select its corresponding Eigen vector. Accordingly, the process may, for example, analyze at least part of the results of a SVD analysis (e.g., the Eigen values) and determine the largest Eigen value. After completing act 411, the process may continue to act 413.

During act 413, the process may form a composite image based upon combined (composite) image information which corresponds with the previously determined largest Eigen value as a composite image. Thus, a combined image corresponding to the largest Eigen value may be used as a composite image. Formation of the composite image is illustratively further discussed above with reference to act 409 as may be suitably applied herein in accordance with embodiments of the present system. The composite image may be a combined image corresponding to the determined largest Eigen value. In accordance with embodiments of the present system, this image may have a significantly lower noise and/or artifact level than images obtained using conventional averaging methods. After completing act 413, the process may continue to act 415.

During act 415, the process may normalize the energy of the composite image using a suitable normalization method. For example, the process may use a normalization method which may determine an L2 norm of the composite image (e.g., composite image information corresponding to the composite image) and the composite image divides the L2 norm of itself and multiply the L2 norm of one of the original images, such as the first one of the image set, or the average of the L2 norm of all original images. After completing act 415, the process may continue to act 417.

During act 417, the process may render the normalized composite image information on a display of the system for the user's convenience. Further, the process may further provide a user interface (UI) with which a user may interact to change viewing parameters, enter information (e.g., notes, commands, selections, etc.), etc. In accordance with embodiments of the present system, one or more of image acquisition, processing and rendering may occur in real time or may be delayed such as through image storage (e.g., see, act 419) and subsequent processing, if desired. After completing act 417, the process may continue to act 419.

During act 419, the process may store information generated by the process such as the MR image information, the generated combined image, etc. in memory of the system for later use. As may be readily appreciated, at any time during and/or after the process 400, information may be stored for subsequent rendering and/or processing. After completing act 419, the process may continue to act 421 where the process may end.

Test Results

Results of two tests of the process 400 in accordance with embodiments of the present system are discussed below as illustrated in first and second tests.

Figures 6A, 6B:
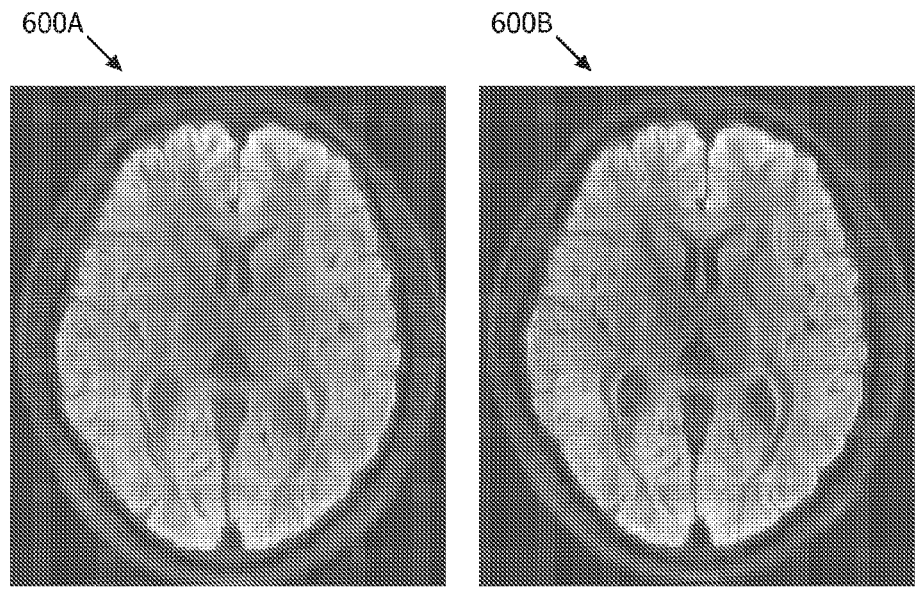
FIG. 6A shows multi-shot DWI image reconstructed in accordance with conventional averaging methods.
FIG. 6B shows a multi-shot DWI image reconstructed using an Eigen-analysis combination method operating in accordance with embodiments of the present system.

In the first test, a multi-shot DWI image was acquired with a NS=4. Then, the acquired DWI image was reconstructed as shown in FIG. 6A which shows multi-shot DWI image reconstructed in accordance with conventional averaging methods; and reconstructed as shown in FIG. 6B which shows a multi-shot DWI image reconstructed using an Eigen-analysis combination method operating in accordance with embodiments of the present system. Comparing the results of FIGS. 6A and 6B, it is seen that embodiments of the present system may result in a higher contrast-to-noise ratio (CNR) than conventional methods.

Figure 7A:
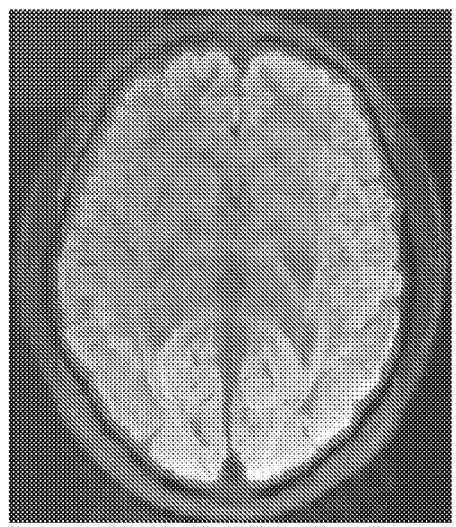
FIG. 7A shows an 8-shot EPI DWI image reconstructed in accordance with a conventional averaging method.
Figure 7B:

The second test, illustrates that embodiments of the present system may provide images with a lower artifact level than may be obtained using a conventional averaging method when a subset of these images contains artifacts. Two data sets were used. One data set corresponds with an 8-shot EPI DWI image; the other one corresponds with a 4-shot TSE liver image. In both of these data sets, a single image was generated with single shot. These images are shown in FIGS. 7A-7B and 8A-8B below wherein FIG. 7A shows an 8-shot EPI DWI image reconstructed in accordance with a conventional averaging method; and 7B shows an 8-shot EPI DWI image reconstructed in accordance with embodiments of the present system. FIG. 8A shows a 4-shot TSE liver image reconstructed in accordance with a conventional averaging method; and FIG. 8B shows a 4-shot TSE liver image reconstructed in accordance embodiments of the present system. In FIGS. 7A and 7B, the same 8-shot EPI DWI image data set was used and the resulting images 700A and 700B are combined images of all shots in the data set. Similarly, in FIGS. 8A and 8B the same 4-shot TSE data set was used and the resulting images 800A and 800B are combined images of all shots in the data set. With regard to FIG. 8A, arrows 810 show the locations of artifacts.

Thus, embodiments of the present system may form a set of images (e.g., with NS>1) which theoretically should be the same. However, due to various reasons during data acquisition such as noise, etc., one or more may be slightly differ. Then, the process may use an Eigen analysis method operating in accordance with embodiments of the present system to extract common features from the set of images of a multi-shot set. Then, a combined image corresponding to the largest Eigen value may be selected as a composite image, the latter of which may be rendered on a display of the system for the convenience of a user and/or stored in a memory of the system for later use such as processing, etc. This method may result in significantly lower noise and/or artifact levels than conventional averaging-based methods.

Low-Rank Method

In accordance with other embodiments of the present system, there is provided a self-navigation reconstruction algorithm for ms-EPI which works robustly even when the number of shots increases (e.g., for a high number of shots) to, for example, 18 shots. However, other values and/or ranges of values are also envisioned. As discussed above, conventional MUSE methods may fail when the number of shots is greater than 4. This is illustrated with comparison of FIGS. 9A and 9B, wherein FIG. 9A shows a 1-shot SENSE-based reconstruction 900A; and FIG. 9B shows an example of an 8-shot SENSE-based reconstruction wherein notable artifacts are present.

FIG. 10 is a flow diagram that illustrates a process 1000 performed by a magnetic resonance system in accordance with embodiments of the present system. In operation, the process may start during act 1001 and then proceed to act 1003.

During act 1003, the process may perform a multi-shot image acquisition process to acquire MR image data (e.g., echo information, analog MR information, etc.) for a multi-shot sequence (e.g., a multi-shot set) comprising a number of shots. The acquisition may be performed using any suitable imaging method such as high-spatial-resolution multi-shot EPI, DWI, and/or TSE. After completing act 1003, the process may continue to act 1005. The second term for example in Equation 2 may be used for this purpose. Accordingly, in accordance with embodiments of the present system, a larger rank will result in larger total energy in Eq. 2. However, in accordance with embodiments of the present system, to minimize the energy, the rank of reconstructed images may be penalized.

During act 1005, the process may enforce low rank of the set of images from the multi-shots and/or number of signal averages (R3). This low-rank enforcement may be applied to complex data, or magnitude and phase separately. In accordance with embodiments of the present system, multi-shot imaging may be treated as accelerated dynamic imaging. Each single shot may correspond with one static image of the multi-shot set and may be considered to form a dynamic image set. Hence the acceleration factor of the dynamic image set is equal to the number of shots in the multi-shot set. A unique property of this dynamic image set is that the image for each corresponding shot of the multi-shot image set should theoretically be same if there is no motion. Thus, if there is no substantial continuous motion in the image shots of the multi-shot image set, it is expected that these images would then be substantially similar to each other and a rank of the multi-shot set should be low as will be discussed below with respect to Equation 2 below. Accordingly, embodiments of the present system may employ a low-rank property to solve an accelerated dynamic imaging problem in accordance with embodiments of the present system. A mathematical model of the proposed low-rank method may be expressed as:

$$E(I_s) = \sum_{s=1}^{s=Ns} \underbrace{\|FI_s - k_s\|_2^2}_{FDF} + \underbrace{\gamma rank(I_s)}_{LRR}, \quad \text{Eq. (2)}$$

where s is a count of a shot (e.g. a shot index); $I_s$ is the image of shot s; F is an encoding operator; $k_s$ is acquired (k-space for the current shot) data for shot s; F is the Fourier transform; rank(*) is a rank calculation operator, rank is a mathematical measure to describe the linear dependency of vectors in a matrix, which is an integer greater than or equal to 1 and smaller or equal to the size of the matrix (e.g., as per convention); γ is a non-negative parameter to balance the first and second terms of the equation which may be respectively known as a first data fidelity (FDF) term and a low-rank regularization (LRR) term, respectively, as shown and which will be further discussed below. An example value of γ could be 1. A larger γ may emphasize low rank, and the reconstructed image may have high signal-to-noise ratio (SNR) but higher artifact level. A smaller γ emphasize the fidelity term more, and the reconstructed image may have low SNR but lower artifact level. Since a number of signal averages (NSA) for the acquisition of DWI is often larger than 1 to improve the SNR, s can include both a number of shots (Ns) and a number of average. As described above, each full k-space contains NS shots. The same subject may be scanned NEX times to result in NEX full k-spaces. Hence, in total, the process may acquire NS×NEX shots. The values or NS and NEX may be set by the system (e.g., obtained from a memory or calculated based upon system parameters) or the user. The first data fidelity term may be the same as the SENSE term. The low-rank regularization term, which forces a low rank property of the images (of shots) corresponding to multi-shots of the same subject (e.g., within the same multi-shot set). Hence, the mathematical model may be considered a modified low-rank-regularized SENSE method.

As discussed above, if there is no motion at all, then all of these images should be exactly the same of a multi-shot set and the rank is one. If there is only occasional relatively large scale motion, the rank may remain low (substantially equal to or close to 1. In these scenarios, the mathematical model is theoretically sound. However, the model may fail when there is continuous random motion during image acquisition. Accordingly, if the model fails, reconstructed images may include artifacts and accuracy may be reduced. When there is no large scale motion in ms-EPI, the rank can equal one and may be enforced for the magnitude of $I_s$ since all of the magnitude of the images of all shots of the multi-shot set may be considered to be exactly same.

In accordance with some embodiments, the process may generate at least one average image for example using SVD analysis to enforce a low-rank regularization. For example, the process may employ SVD analysis to perform low-rank regularization (e.g., with a rank=1). This SVD analysis may be used to determine an average image based on the set of images from a multi-shot set.

After completing act 1005, the process may continue to act 1007 during which the process may reconstruct a final image based upon the final reconstruction which is a registered average of $I_s$. The result of act 1005 may include a set of images. If a rank which is equal to one is used, then the output is one image, which may be used as the final reconstruction image. However, if the rank is greater than one is used, then the output may include a set of images which may be used as the final reconstruction images. It is possible that the magnitude of these images (e.g., the latter case) are different. Accordingly, the process may register the magnitudes for each of these images of the set of images before an averaging operation is performed. After completing act 1007, the process may continue to act 1009.

During act 1009, the process may render the final image on a display of the system for the user's convenience. The process may further provide a user interface (UI) with which a user may interact to change viewing parameters, enter information (e.g., notes, commands, selections, etc.), etc. In accordance with embodiments of the present system, one or more of image acquisition, processing and rendering may occur in real time or may be delayed, if desired. After completing act 1009, the process may continue to act 1011.

During act 1011, the process may store information generated by the process such as the final image, the acquired MR information, etc. in memory of the system for later use. As may be readily appreciated, at any time during and/or after the process 1000, information may be stored for subsequent rendering and/or processing. After completing act 1011, the process may continue to act 1013, where the process may end.

Embodiments of the present system may employ Cartesian or non-Cartesian trajectories, such as a multi-shot spiral.

In accordance with embodiments of the present system, phase (or the image itself) of each shot of a multi-shot image set and a to-be reconstructed image may be treated as two unknowns. These unknowns, may then be solved iteratively and jointly using methods in accordance with embodiments of the present system.

In accordance with embodiments of the present system, in the convolution method and the low rank method discussed herein, one step in each is to generate an average image. In accordance with embodiments of the present system, the SVD average scheme discussed herein may be adopted to calculate an average image. For example, in one or more iterations of the convolution method discussed herein, an average image may be calculated for example using the SVD average scheme discussed herein. In accordance with embodiments of the present system, each iteration of the convolution method discussed herein may use the SVD average scheme discussed herein.

Further, in accordance with embodiments of the present system, the low rank method discussed herein may use the SVD average scheme as a particular implementation for low rank regularization (rank=1).

Test Results

Sample high resolution diffuser tensor imaging (DTI) images were acquired on a Philips™ 3T Achieva™ system with an 8-channel (ch) head coil (manufactured by the Invivo Corp., Gainesville, U.S.A). More particularly, a data acquisition was performed using a multi-shot EPI sequence with a twice-refocused spin-echo scheme and the following parameters: (b=800 s/mm2, number of average=4, number of directions=6, FOV=230 mm2, in-plane spatial resolution=0.8 mm2, slice thickness 4 mm, partial Fourier ratio=0.6, FA=90°, TR=2.8 s, and TE=70 ms). The number of shots was set to 4 and 8, depending upon the test as is described below.

FIG. 11 shows an FA map 1100 generated using a 4-shot shot data set operating in accordance with embodiments of the present system. The FA map 1100 shows four images a through d, where image a was obtained using a proposed low rank SENSE imaging method operating in accordance with embodiments of the present system and image b was obtained using a MUSE imaging method and images c and d are zoomed-in images of images a and b, respectively. The images obtained using the low-rank SENSE and MUSE methods exhibit similar image quality.

FIG. 12 shows an FA map 1200 generated using an 8-shot data set operating in accordance with embodiments of the present system. The FA map 1200 shows four images where each of the columns show a different slice and the upper row shows images obtained using a low-rank SENSE method and the lower row shows images obtained using a MUSE method. When the number of shots was set to eight, the initial SENSE in MUSE had an acceleration factor of 8. However, an 8-channel coil did not provide information for a meaningful reconstruction to provide the necessary phase information for the MUSE method. Hence, the images reconstructed using the MUSE method are unacceptable. On the other hand, the low-rank SENSE method still provided a high-image quality.

FIG. 13 shows a map 1300 generated using an 8-shot data set operating in accordance with embodiments of the present system. The map 1300 includes four images corresponding to in-vivo brain DWI data using a regular spiral setting without the user of a navigator. These images were acquired on a Philips™ 3T scanner with the following parameters: 8 channels, 8 shots, TE/TR=46/2900 ms, FOV=210×210 mm, resolution=0.86×0.86 mm, slice thickness=3 mm, b-value=800 s/mm2, diffusion directions=15, readout duration=30 ms.

FIG. 14 shows a map 1400 generated using a 12-shot data set operating in accordance with embodiments of the present system. The map 1400 includes four images corresponding to in-vivo brain DWI data using a regular spiral setting without the user of a navigator. These images were acquired on a Philips™ 3T scanner with the following parameters: 32 channels, 12 shots, TE/TR=49/2500 ms, FOV=220×220 mm, resolution=0.9×0.9 mm, slice thickness=4 mm, b-value=1000 s/mm2, diffusion directions=6, readout duration=18 ms.

More particularly, the images in each of the maps 1300 and 1400 are arraigned in left and right columns within the corresponding maps 1300 and 1400, and in each of these maps, the images in the left column were reconstructed using a SENSE+CG method and the images in the right column were reconstructed using a low rank SENSE method operating in accordance with embodiments of the present system. The white arrows may demonstrate a region that the reconstruction of low rank SENSE has higher SNR than a conventional SENSE+CG method.

Accordingly, embodiments of the present system may provide systems and methods to effectively reduce artifacts due to inter-shot motion in multi-shot acquisitions. Embodiments of the present system may be particularly suitable for use with high-spatial-resolution multi-shot EPI DWI, and TSE imaging systems and methods.

A method to reconstruct a target image operating in accordance with embodiments of the present system is discussed with reference to FIG. 15 which shows a flow diagram that illustrates a process 1500 that may be performed by a magnetic resonance system in accordance with embodiments of the present system. The process 1500 may be performed using one or more computers communicating over a network and may obtain information from, and/or store information to one or more memories which may be local and/or remote from each other. The process 1500 and other processes herein in accordance with embodiments of the present system may include one of more of the following acts. Further, one or more of these acts may be combined and/or separated into sub-acts, if desired. Further, one or more of these acts may be skipped depending upon settings. The image information may include, for example, image information acquired from a multi-shot image sequence. In operation, the process 1500 may start during act 1501 and then proceed to act 1503.

During act 1503, the process may perform a multi-shot acquisition process to acquire MR information (e.g., echo information, analog MR information, etc.) for at least one multi-shot set (e.g., a shot set) comprising a plurality of shots. The multi-shot acquisition process may be performed in accordance with a multi-shot sequence such as an ms-EPI diffusion-weighed image (DWI) scan sequence. In accordance with some embodiments, the ms-EPI scan may be of interleaved- and/or read-out direction-types. The multi-shot acquisition process may further be performed using any suitable multi-shot acquisition method such as turbo-spin echo (TSE), multi-shot spiral, PROPELLOR, and/or ms-echo-planar imaging (ms-EPI) methods. Each multiple-shot set may include NS shots and may be scanned NEX times. Thus, in accordance with embodiments of the present system, the process may acquire NS*NEX images. Accordingly, the process may acquire MR information (e.g., echo information, analog MR information, etc.) for NS*NEX images and the process may acquire a number (e.g., which may be equal to NEX) of same images. Illustratively, this act may be similar to for example act 403 herein, although other methods of image acquisition may be suitably applied. After completing act 1503 the process may continue to act 1505.

During act 1505, the process may perform a joint reconstruction where the NS*NEX images and the target image are treated as unknown sets. The process may then numerically solve these two sets of unknowns jointly using any suitable mathematical method or methods. For example, the process may use a convolution and/or low rank methods (as discussed with respect to the flow diagrams of FIGS. 2 and 10, respectively) operating in accordance with embodiments of the present system to obtain the numerical solution of these two sets of unknowns jointly. It is further envisioned that the numerical solution may be obtained simultaneously or sequentially so as to numerically solve the two sets of unknowns jointly. During this process, the process may iteratively calculate solutions for the NS*NEX images and the target image using at least one of a convolution method and a low-rank method in accordance with embodiments of the present system to solve the unknown sets (e.g., the multi-shot sets) to determine the target image. After completing act 1505, the process may continue to act 1507.

During act 1507, the process may render the jointly reconstructed target image on a display of the system for the user's convenience. Further, the process may further provide a user interface (UI) with which a user may interact to change viewing parameters, enter information (e.g., notes, commands, selections, etc.), etc. In accordance with embodiments of the present system, one or more of image acquisition, processing and rendering may occur in real time or may be delayed such as through image storage and subsequent processing, if desired. After completing act 1507, the process may continue to act 1509.

During act 1509, the process may store information generated by the process such as the MR image information, the calculated target image, etc. in a memory of the system for example for later use. As may be readily appreciated, at any time during and/or after the process 1500, information may be stored for subsequent rendering and/or processing. After completing act 1509, the process may continue to act 1511 where the process may end.

Embodiments of the present system may treat both the phase of the image (or the image itself) by each shot and the to-be reconstructed image (e.g., the target image) as two unknowns, and these two unknowns may be solved iteratively and jointly. In contrast, conventional methods may obtain some solution to these two unknowns independently which may yield inferior image quality when compared to image quality that may be obtained in accordance with embodiments of the present system.

Embodiments of the present system may reconstruct a single target image. To improve the quality of the single target image over that obtained by conventional methods, it is envisioned that a process operating in accordance with embodiments of the present system may acquire multi-shot data (e.g., NS) for number of signal average (e.g., NSA, or NEX) times, and produce NS×NEX images. Then, the process may then iteratively calculate a solution for the NS×NEX images and the target image. The process may not need to determine phase information for the NS*NEX images prior to reconstructing the target image. In accordance with embodiments of the present system, the process may treat both the NS×NEX images and the target image as unknowns and calculate solutions for these two sets of unknowns jointly. In accordance with some embodiments, the calculations employ a convolution method and/or a low-rank method to obtain the solutions. Further, the calculations to determine the solutions for the two sets of unknowns may be performed either simultaneously or sequentially.

Further, embodiments of the present system may further employ an SVD average method (e.g., see, FIG. 4) to determine a target image. For example, the convolution and/or low-rank methods may employ an SVD averaging method to determine a target image from multi-shot image information such as from the NS*NEX images.

FIG. 16 shows a portion of a system 1600 in accordance with embodiments of the present system. For example, a portion of the present system may include a processor 1610 (e.g., a controller) operationally coupled to a memory 1620, a display 1630, RF transducers 1660, magnetic coils 1690, and a user input device 1670. The memory 1620 may be any type of device for storing application data as well as other data related to the described operation. The application data and other data are received by the processor 1610 for configuring (e.g., programming) the processor 1610 to perform operation acts in accordance with the present system. The processor 1610 so configured becomes a special purpose machine particularly suited for performing operations in accordance with embodiments of the present system.

The operation acts may include configuring an MRI system by, for example, controlling the magnetic coils 1690, and/or the RF transducers 1660. The magnetic coils 1690 may include main magnetic coils, and gradient coils (e.g., x-, y-, and z-gradient coils) and may be controlled to emit a main magnetic field and/or gradient fields in a desired direction and/or strength. The controller may control one or more power supplies to provide power to the magnetic coils 1690 so that a desired magnetic field is emitted at a desired time. The RF transducers 1660 may be controlled to transmit RF pulses at the patient and/or to receive echo information therefrom. A reconstructor may process received signals such as the echo information and transform them (e.g., using one or more reconstruction techniques of embodiments of the present system) into content which may include image information (e.g., still or video images (e.g., video information)), data, and/or graphs that can be rendered on, for example, a user interface (UI) of the present system such as on the display 1630, etc. Further, the content may then be stored in a memory of the system such as the memory 1620 for later use. Thus, operation acts may include requesting, providing, and/or rendering of content such as, for example, reconstructed image information obtained from echo information as described herein. The processor 1610 may render the content such as video information on a UI of the system such as a display of the system.

The user input 1670 may include a keyboard, a mouse, a trackball, or other device, such as a touch-sensitive display, which may be stand alone or be a part of a system for communicating with the processor 1610 via any operable link. The user input device 1670 may be operable for interacting with the processor 1610 including enabling interaction within a UI as described herein. Clearly the processor 1610, the memory 1620, display 1630, and/or user input device 1670 may all or partly be a portion of a computer system or other device such as an MR system.

The methods of the present system are particularly suited to be carried out by a computer software program, such program containing modules corresponding to one or more of the individual steps or acts described and/or envisioned by the present system. Such program may of course be embodied in a computer-readable medium, such as an integrated chip, a peripheral device or memory, such as the memory 1620 or other memory coupled to the processor 1610.

The program and/or program portions contained in the memory 1620 may configure the processor 1610 to implement the methods, operational acts, and functions disclosed herein.

The processor 1610 is operable for providing control signals and/or performing operations in response to input signals from the user input device 1670 as well as in response to other devices for example of a network 1680 and executing instructions stored in the memory 1620. The processor 1610 may include one or more of a microprocessor, an application-specific or general-use integrated circuit(s), a logic device, etc. Further, the processor 1610 may be a dedicated processor for performing acts in accordance with the present system or may be a general-purpose processor wherein only one of many functions operates for performing in accordance with the present system. The processor 1610 may operate utilizing a program portion, multiple program segments, or may be a hardware device utilizing a dedicated or multi-purpose integrated circuit.

Embodiments of the present system may provide fast imaging methods to acquire and reconstruct multi-shot images. Suitable applications may include imaging systems such as MRI and MRS systems and the like which require: a short acquisition time and high resolution while eliminating adverse effects such as due to chemical shift and main field inhomogeneity. Further variations of the present system would readily occur to a person of ordinary skill in the art and are encompassed by the following claims.

Finally, the above-discussion is intended to be merely illustrative of the present system and should not be construed as limiting the appended claims to any particular embodiment or group of embodiments. Thus, while the present system has been described with reference to exemplary embodiments, it should also be appreciated that numerous modifications and alternative embodiments may be devised by those having ordinary skill in the art without departing from the broader and intended spirit and scope of the present system as set forth in the claims that follow. In addition, the section headings included herein are intended to facilitate a review but are not intended to limit the scope of the present system. Accordingly, the specification and drawings are to be regarded in an illustrative manner and are not intended to limit the scope of the appended claims.

In interpreting the appended claims, it should be understood that:

a) the word "comprising" does not exclude the presence of other elements or acts than those listed in a given claim;

b) the word "a" or "an" preceding an element does not exclude the presence of a plurality of such elements;

c) any reference signs in the claims do not limit their scope;

d) several "means" may be represented by the same item or hardware or software implemented structure or function;

e) any of the disclosed elements may be comprised of hardware portions (e.g., including discrete and integrated electronic circuitry), software portions (e.g., computer programming), and any combination thereof;

f) hardware portions may be comprised of one or both of analog and digital portions;

g) any of the disclosed devices or portions thereof may be combined together or separated into further portions unless specifically stated otherwise;

h) no specific sequence of acts or steps is intended to be required unless specifically indicated; and i) the term "plurality of" an element includes two or more of the claimed element, and does not imply any particular range of number of elements; that is, a plurality of elements may be as few as two elements, and may include an immeasurable number of elements.

REFERENCES

References 1 through 9 listed below are incorporated herein by reference and are referred to herein using reference numerals R1 through R9, respectively, throughout the specification. For example, R1 may make reference to the first reference (e.g., by Chen N-k).

1. Chen N-k, Guidon A, Chang H-C, Song A W. A robust multi-shot scan strategy for high-resolution diffusion weighted MRI enabled by multiplexed sensitivity-encoding (MUSE). NeuroImage 2013; 72:41-47.
2. Pruessmann K P, Weiger M, Scheidegger M B, Boesiger P. SENSE: Sensitivity encoding for fast MRI. MagnReson Med 1999; 42:952-962.
3. Zhao B, Haldar J P, Brinegar C, Liang Z-P. Low rank matrix recovery for real-time cardiac MRI. IEEE ISBI; 2010. p 996-999.
4. Jeong H-K, Gore J C, Anderson A W. High-Resolution Human Diffusion Tensor Imaging Using 2-D Navigated Multishot SENSE EPI at 7 T. MagnReson Med 2013; 69:793-802.
5. Fautz H P, Honal M, Saueressig U, Schafer O, Kannengiesser S A R. Artifact Reduction in Moving-Table Acquisitions Using Parallel Imaging and Multiple Averages. Magn Reson Med 2007; 57:226-232.
6. Walsh D O, Gmitro A F, Marcellin M W. Adaptive Reconstruction of Phased Array MR Imagery. Magn Reson Med 2000; 43:682-690.
7. Huang F, Lin W, Bömert P, Li Y, Reykowski A. Data COnvolution and Combination OperAtion (COCOA) for Motion Ghost Artifacts Reduction. MagnReson Med 2010; 64(1):157-166.
8. Truong T K, Chen N K, Song A W. Inherent correction of motion-induced phase errors in multishot spiral diffusion-weighted imaging. Magn Reson Med 2012; 68(4):1255-1261.
9. Griswold M A, Jakob P M, Heidemann R M, Mathias Nittka, Jellus V, Wang J, Kiefer B, Haase A. Generalized Autocalibrating Partially Parallel Acquisitions (GRAPPA). Magn Reson Med 2002; 47:1202-1210.

What is claimed is:

1. A magnetic resonance (MR) imaging (MRI) system, the system comprising at least one controller configured to:
perform a multi-shot image acquisition process to acquire MR information for at least one multi-shot image set comprising a plurality of image shots each including corresponding data, at least a portion of the MR information being obtained with the use of a gradient and at least another portion of the MR information being obtained without the use of the gradient;

train a convolution kernel comprising data on at least a portion of the MR information obtained without the use of the gradient or by using a self-training process, the convolution kernel comprising convolution data;

iteratively convolve the MR information obtained with the use of a gradient for at least two of the plurality of image shots of the at least one multi-shot image set with the trained convolution kernel to form synthetic k-space data for each corresponding shot of the at least two image shots of the plurality of image shots to correct for motion errors, wherein the synthetic k-space data is formed by enforcing data consistency between at least two of the plurality image shots during the iterative convolution;

project the synthetic k-space data for the at least two image shots of the plurality of image shots of the at least one multi-shot image set into image space; and average the projected synthetic k-space data that are projected into the image space to form image information.

2. The MRI system of claim 1, wherein the at least one controller holds the data of the convolution kernel constant when performing the iterative convolution for the corresponding multi-shot set.

3. The MRI system of claim 1, wherein the at least one controller is further configured to fix the data of the convolution kernel so as to form a consistent correlation during the iterative convolution for the at least one multi-shot image set.

4. The MRI system of claim 1, wherein the synthetic k-space data forms a number of shot (Ns) sets of synthetic k-space data.

5. The MRI system of claim 1, wherein during the averaging the at least one controller is configured to average magnitudes of the synthetic k-space data for the at least two shots of the plurality of image shots.

6. The MRI system of claim 1, further comprising a display wherein the at least one controller is further configured to render the formed image information on the display.

7. A method of reconstructing images obtained by a magnetic resonance (MR) imaging (MRI) system having at least one controller, the method performed by the least one controller of the MR imaging system, and comprising acts of:

performing a multi-shot image acquisition process to acquire MR information for at least one multi-shot image set comprising a plurality of image shots each including corresponding data, at least a portion of the MR information being obtained with the use of a gradient and at least another portion of the MR information being obtained without the use of the gradient;

training a convolution kernel comprising data on at least a portion of the MR information obtained without the use of the gradient, the convolution kernel comprising convolution data;

iteratively convolving the MR information obtained with the use of a gradient for at least two of the plurality of image shots of the at least one multi-shot image set with the trained convolution kernel to form synthetic k-space data for each corresponding shot of the at least two image shots to correct for motion errors, wherein the synthetic k-space data is formed by enforcing data consistency between at least two of the plurality image shots during the iterative convolution;

projecting the synthetic k-space data for the at least two of the plurality of image shots into image space; and averaging the projected synthetic k-space data that are projected into image space to form image information.

8. The method of claim 7, wherein the method further comprise an act of holding the data of the convolution kernel constant when performing the iterative convolution for the corresponding multi-shot set.

9. The method of claim 7, wherein the method further comprise an act of fixing the data of the convolution kernel so as to form a consistent correlation during the iterative convolution for the at least one multi-shot image set.

10. The method of claim 7, wherein the synthetic k-space data forms a number of shot (Ns) sets of synthetic k-space data.

11. The method of claim 7, wherein the act of averaging further comprises averaging magnitudes of the synthetic k-space data for the at least two shots of the at least one multi-shot image set.

12. The MRI system of claim 7, wherein the method further comprise an act of rendering the formed image information on a display.

13. A computer-readable non-transitory memory medium storing a computer program configured to control a magnetic resonance (MR) image system to:

perform a multi-shot image acquisition process to acquire MR information for at least one multi-shot image set comprising a plurality of image shots each including corresponding data, at least a portion of the MR information being obtained with the use of a gradient and at least another portion of the MR information being obtained without the use of the gradient;

train a convolution kernel comprising data on at least a portion of the MR information obtained without the use of the gradient, the convolution kernel comprising convolution data;

iteratively convolve the MR information obtained with the use of a gradient for at least two of the plurality of image shots of the at least one multi-shot image set with the trained convolution kernel to form synthetic k-space data for each corresponding shot of the at least two image shots to correct for motion errors, wherein the synthetic k-space data is formed by enforcing data consistency between at least two of the plurality image shots during the iterative convolution;

project the synthetic k-space data for the at least two image shots of the plurality of image shots of the at least one multi-shot image set into image space; and average the projected synthetic k-space data that are projected into the image space to form image information.

14. The computer-readable medium of claim 13, wherein the program portion is further configured to hold the data of the convolution kernel constant when performing the iterative convolution for the corresponding multi-shot set.

15. The computer-readable medium of claim 13, wherein the program portion is further configured to fix the data of the convolution kernel so as to form a consistent correlation during the iterative convolution for the at least one multi-shot image set and/or during averaging the program portion is further configured to average magnitudes of the synthetic k-space data for the at least two shots of the at least one multi-shot image set.

16. The computer-readable medium of claim 13, wherein during averaging the program portion is further configured to average magnitudes of the synthetic k-space data for the at least two shots of the at least one multi-shot image set.

17. The computer-readable medium of claim 13, wherein the program portion is further configured to render the formed image information on a display.

18. A magnetic resonance imaging system comprising:
- a magnetic resonance scanner configured to perform a multi-shot image acquisition process to acquire MR information in k-space for at least one multi-shot image data set including a plurality of image shots each including corresponding k-space data, a diffusion weighted portion of the MR information being obtained with the use of a gradient and a non-diffusion weighted portion of the MR image information being obtained without the use of the gradient;
- at least one computer processor configured to:
  - iteratively convolve the diffusion weighted portion of the MR information for at least two of the plurality of image shots of the at least one multi-shot image data set with a trained convolution kernel to form synthetic k-space data for each corresponding shot of the at least two image shots of the plurality of image shots to correct for motion images, wherein the synthetic k-space data is formed by enforcing data consistency between at least two of the plurality of image shots during the iterative convolution, wherein the trained convolution kernel is trained using the non-diffusion weighted portion of the MR information obtained without the use of the gradient or by using a self-training process,
  - averaging and projecting the synthetic k-space data for the at least two image shots of the plurality of image shots of the at least one multi-shot image data set into image space to form images; and
- a display device configured to display the images.

* * * * *